(12) United States Patent
Yamamoto et al.

(10) Patent No.: US 12,479,881 B2
(45) Date of Patent: Nov. 25, 2025

(54) METHOD FOR PRODUCING PEPTIDE COMPOUND, PROTECTIVE GROUP-FORMING REAGENT, AND CONDENSED POLYCYCLIC AROMATIC HYDROCARBON COMPOUND

(71) Applicant: FUJIFILM CORPORATION, Tokyo (JP)

(72) Inventors: Yosuke Yamamoto, Kanagawa (JP); Kazuhei Kaneko, Kanagawa (JP); Motomasa Takahashi, Kanagawa (JP); Makoto Takahashi, Kanagawa (JP); Mika Imamura, Kanagawa (JP); Hirotaka Satou, Kanagawa (JP); Hirofumi Omura, Kanagawa (JP); Yuji Yoshimitsu, Kanagawa (JP); Daisuke Nakagawa, Kanagawa (JP); Keita Tanaka, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 17/408,474

(22) Filed: Aug. 22, 2021

(65) Prior Publication Data
US 2021/0380634 A1 Dec. 9, 2021

Related U.S. Application Data

(63) Continuation of application No. PCT/JP2020/007477, filed on Feb. 25, 2020.

(30) Foreign Application Priority Data

Feb. 28, 2019 (JP) ................. 2019-035853

(51) Int. Cl.
| | | |
|---|---|---|
| C07C 43/23 | (2006.01) | |
| C07K 1/06 | (2006.01) | |
| C07K 5/083 | (2006.01) | |
| C07K 5/103 | (2006.01) | |
| C07K 5/107 | (2006.01) | |

(52) U.S. Cl.
CPC .............. *C07K 1/061* (2013.01); *C07C 43/23* (2013.01); *C07K 1/062* (2013.01); *C07K 5/0808* (2013.01); *C07K 5/101* (2013.01); *C07K 5/1016* (2013.01); *Y02P 20/55* (2015.11)

(58) Field of Classification Search
CPC ........ C07C 43/23; C07K 1/061; C07K 1/062; C07K 5/0808; C07K 5/101; C07K 5/1016; Y02P 20/55
See application file for complete search history.

(56) References Cited

U.S. PATENT DOCUMENTS

| | | |
|---|---|---|
| 2,825,734 A | 3/1958 | Speeter et al. |
| 3,957,288 A | 5/1976 | Lemahieu et al. |
| 9,284,344 B2 | 3/2016 | Kim et al. |
| 2010/0029904 A1 | 2/2010 | Chiba et al. |
| 2010/0240867 A1 | 9/2010 | Takahashi |
| 2010/0249374 A1 | 9/2010 | Takahashi |
| 2011/0160433 A1 | 6/2011 | Takahashi |
| 2012/0296074 A1 | 11/2012 | Hirai et al. |
| 2014/0046022 A1 | 2/2014 | Takahashi |
| 2014/0213761 A1 | 7/2014 | Takahashi |
| 2015/0112053 A1 | 4/2015 | Kim et al. |
| 2016/0060198 A1 | 3/2016 | Takahashi |
| 2017/0320904 A1 | 11/2017 | Hirai et al. |

(Continued)

FOREIGN PATENT DOCUMENTS

| | | |
|---|---|---|
| CN | 108473526 A | 8/2018 |
| EP | 4006045 A1 | 6/2022 |

(Continued)

OTHER PUBLICATIONS

Murayama et al. ("Enantioselective Synthesis, Crystal Structure, and Photophysical Properties of 1,1'-Bistriphenylene-Based Sila[7] helicene", Eur. J. Org. Chem., 2015, pp. 1409-1414) (Year: 2015).*
Takahashi et al. ("Evaluation of energy transfer in perylene-cored anthracene dendrimers", Chem. Commun., 2006, 3084-3086) (Year: 2006).*
Supporting information of Kaucher, M. S. et al. "Selective Transport of Water Mediated by Porous Dendritic Dipeptides" J. Am. Chem. Soc. 2007, 129, 11698-11699, pp. S1-S16 (Year: 2007).*
Office Action dated Oct. 12, 2022, issued by the CIPO in corresponding Canadian Patent Application No. 3,131,774.
Office Action dated Oct. 21, 2022, issued by the CIPO in corresponding Canadian Patent Application No. 3,131,772.

(Continued)

*Primary Examiner* — Medhanit W Bahta
(74) *Attorney, Agent, or Firm* — SOLARIS Intellectual Property Group, PLLC

(57) ABSTRACT

Provided are a method for producing a peptide compound including a step of using a condensed polycyclic aromatic hydrocarbon compound represented by Formula (1); a protective group-forming reagent including the compound; and the compound. In Formula (1), a ring A represents a condensed polycyclic aromatic hydrocarbon ring, $Y^A$'s each independently represent —$CH_2OH$, —$CH_2NHR$, —$CH_2SH$, or —$CH_2X^0$, where R represents a hydrogen atom, an alkyl group, or an aralkyl group, and $X^0$ represents Cl, Br, or I, k represents an integer of 1 to 5, n represents 1 or 2, and $R^A$'s each independently represent an aliphatic hydrocarbon group or an organic group having an aliphatic hydrocarbon group.

(1)

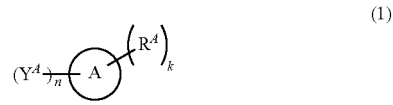

14 Claims, No Drawings

(56) References Cited

U.S. PATENT DOCUMENTS

| | | | |
|---|---|---|---|
| 2018/0282365 A1 | 10/2018 | Hirai et al. | |
| 2019/0023726 A1 | 1/2019 | Yano et al. | |
| 2019/0031702 A1 | 1/2019 | Rohloff | |
| 2019/0263842 A1 | 8/2019 | Yano et al. | |
| 2021/0380633 A1 | 12/2021 | Yamamoto et al. | |
| 2022/0112233 A1 | 4/2022 | Yamamoto et al. | |

FOREIGN PATENT DOCUMENTS

| | | | |
|---|---|---|---|
| JP | S49-98642 A | 9/1974 | |
| JP | S60-252441 A | 12/1985 | |
| JP | H06-271577 A | 9/1994 | |
| JP | 5979139 B2 | 8/2016 | |
| JP | 2019-035775 A | 3/2019 | |
| JP | 2019-122489 A | 7/2019 | |
| TW | 201734030 A | 10/2017 | |
| WO | 9732837 A1 | 9/1997 | |
| WO | 2004/067522 A1 | 8/2004 | |
| WO | 2007/034812 A1 | 3/2007 | |
| WO | 2010/104169 A1 | 9/2010 | |
| WO | 2010/113939 A1 | 10/2010 | |
| WO | 2011/078295 A1 | 6/2011 | |
| WO | 2012157723 A1 | 11/2012 | |
| WO | 2013/159863 A1 | 10/2013 | |
| WO | 2013179412 A1 | 12/2013 | |
| WO | 2015/168461 A2 | 11/2015 | |
| WO | 2016117663 A1 | 7/2016 | |
| WO | 2017/038650 A1 | 3/2017 | |
| WO | 2017104836 A1 | 6/2017 | |
| WO | 2018/021233 A1 | 2/2018 | |
| WO | 2018203574 A1 | 11/2018 | |
| WO | 2018212236 A1 | 11/2018 | |
| WO | 2020175473 A1 | 9/2020 | |
| WO | 2020262258 A1 | 12/2020 | |
| WO | 2021039935 A1 | 3/2021 | |

OTHER PUBLICATIONS

English language translation of the following: Decision of Refusal dated Nov. 22, 2022 from the JPO in a Japanese patent application No. 2021-502270 corresponding to the instant patent application.
Extended European Search Report dated Sep. 15, 2022, issued in corresponding EP Patent Application No. 20858185.0.
English language translation of the following: Office action dated Sep. 27, 2022 from the JPO in a Japanese patent application No. 2021-526941 corresponding to the instant patent application.
Kaucher, M. S. et al., "Selective Transport of Water Mediated by Porous Dendritic Dipeptides", Journal of the American Chemical Society, 2007, vol. 129, No. 38, pp. 11698-11699, and supporting information pp. S1-S16.
Registry (STN) [ online ] , Jan. 27, 1993 [ retrieval date: May 7, 2020 ] CAS: 145543-42-6 entire text, structural formulas.
Registry ( STN ) [ online ] , Jan. 27, 1993 [ retrieval date : May 7, 2020 ] CAS: 145543-43-7 entire text, structural formulas.
REGISTRY ( STN ) [online] , Sep. 18, 2013 [Retrieval date: May 7, 2020] CAS: 1452164 -35-0 entire text , structural formulas.
Torikai, K. et al. , "N (TT)-2-Naphthylmethoxymethyl-Protected Histidines: Scalable, Racemizaion-Free Building Blocks for Peptide Synthesis", Organic Process Research & Development, Feb. 19, 2020 vol. 24, No. 3, p. 448-453.
International Search Report issued in International Application No. PCT/JP2020/007477 dated Jun. 2, 2020.
Written Opinion of the ISA issued in International Application No. PCT/JP2020/007477 dated Jun. 2, 2020.
Murayama, K. et al., "Synthesis, structure, and photophysical/chiroptical properties of benzopicene-based π-conjugated molecules", Journal of Organic Chemistry, 2017, vol. 82, No. 2, pp. 1136-1144.
Rasale, D. B. et al., "Lipase catalyzed inclusio of gastrodigenin for the evolution of blue light emitting peptide hanofibers", Chemical Communications, 2014, vol. 50, No. 63, pp. 8685-8688.
Ishigaki, Y. et al., "Three-way output molecular response system based on tetrakis (3,4-dialkoxyphenyl)-3, 4-dihydro [5] helicenes: Perturbation of properties by long alkyl chains", Heterocycles, 2015, vol. 90, No. 1, pp. 126-135.
International Search Report issued in International Application No. PCT/JP2020/024231 dated Sep. 8, 2020.
Written Opinion of the ISA issued in International Application No. PCT/JP2020/024231 dated Sep. 8, 2020.
English language translation of the following: Office action dated May 24, 2022 from the JPO in a Japanese patent application No. 2021-502270 corresponding to the instant patent application.
English language translation of the following: Notice of Termination of Reconsideration by Examiners before Appeal Proceedings dated May 9, 2023 from the JPO in a Japanese patent application No. 2021-502270 corresponding to the instant patent application.
Yen-Ju Cheng et al., "Carbazole-Based Ladder-Type Heptacylic Arene with Aliphatic Side Chains Leading to Enhanced Efficiency of Organic Photovoltaics", Chemistry of Materials, 23(9), 2011, pp. 2361-2369, XP055121925, Department of Applied Chemistry, National Chiao Tung University, Taiwan.
Ravi Kumar Cheedarala et al., "Ladder-type heteroacene polymers bearing carbazole and thiophene ring units and their use in field-effect transistors and photovoltaic cells", Journal of Materials Chemistry, 21(3), 2011, pp. 843-850, XP093048796.
Chia Juan Lim et al., "Synthesis and characterization of three thienopyridazine-based copolymers and their application in OFET", Tetrahedron Letters. 57(14), 2016, pp. 1523-1527, XP029442306, published by Elsevier Ltd.
Office Action dated May 30, 2023, issued by the EPO in corresponding EP Patent Application No. 20763894.1.
Office action dated Jul. 11, 2022, from the IPO in a Indian patent application No. 202147038861 corresponding to the Instant patent application.
English language translation of the following: Office action dated May 10, 2022 from the JPO in a Japanese patent application No. 2021-502269 corresponding to the instant patent application. This office action translation is submitted now in order to supplement the understanding of the cited references which are being disclosed in the instant Information Disclosure Statement.
Notice to comply with requirements for patent applications containing nucleotide and/or amino acid sequence disclosures issued by USPTO dated Jul. 3, 2023, in related U.S. Appl. No. 17/409,692.
English language translation of the following: Office action dated Feb. 28, 2023 from the JPO in a Japanese patent application No. 2021-543021 corresponding to the instant patent application. This office action translation is submitted now in order to supplement the understanding of the cited references which are being disclosed in the instant Information Disclosure Statement.
Office action dated Jun. 15, 2022 from the IPO in a Indian patent application No. 202247000909 corresponding to the instant patent application.
Extended European Search Report dated Jun. 23, 2022, issued in corresponding EP Patent Application No. 20831790.9.
Extended European Search Report dated Mar. 17, 2022, issued in corresponding EP Patent Application No. 20763669.7.
English language translation of the following: Decision of Refusal dated Aug. 8, 2023 from the JPO in a Japanese patent application No. 2021-543021 corresponding to the instant patent application.
Office action dated Nov. 15, 2023 from the IPO in a Indian patent application No. 202247000909 corresponding to the instant patent application.
A.F.Mironov et al., "Synthesis and some transformations of pyrroles with aliphatic acyl substituents", Chemistry of Heterocyclic Compounds, vol. 9, p. 22 (1973).
Alfred Treibs et al., "Synthese von tert.-Butyl- und Octadecyl-atioporphyrin", Liebigs Ann. Chem. 751, pp. 127-134 (1971).
Jan Christiansen et al., "Amino-acids and Peptides. Part 46. Synthesis of Bradykinin Analogues Modified in the Vicinity of the Carboxy-Group", Journal of the Chemical Society, Perkin Transactions 1, 1982, pp. 1229-1237.
English language translation of the following: Office action dated Aug. 25, 2023 from the KIPO in a Korean patent application No. 10-2021-7027562 corresponding to the instant patent application.

(56) References Cited

OTHER PUBLICATIONS

This office action translation is submitted now in order to supplement the understanding of the cited references which are being disclosed in the instant Information Disclosure Statement.

English language translation of the following: Office action dated Aug. 25, 2023 from the KIPO in a Korean patent application No. 10-2021-7028084 corresponding to the instant patent application.

English language translation of the following: Office action dated Feb. 23, 2024 from the KIPO in a Korean patent application No. 10-2021-7027562 corresponding to the instant patent application.

Bolsinger et al., "Poly (3,6-carbazolylmethylene)s with fluorinated and nonflourinated tapered building side groups", Polymer Bulletin, 38, pp. 117-124, 1997, Germany.

English language translation of the following: Office action dated Feb. 15, 2024 from the TIPO in a Taiwan patent application No. 109106449 corresponding to the instant patent application.

English language translation of the following: Office action dated Dec. 19, 2023 from the JPO in a Japanese patent application No. 2023-026563 corresponding to the instant patent application.

Requirement for Restriction/Election issued by USPTO on Mar. 21, 2024, in related U.S. Appl. No. 17/409,692.

Office Action dated Mar. 26, 2024, issued by the EPO in corresponding EP Patent Application No. 20763894.1.

English language translation of the following: Office action dated Apr. 18, 2024 from the TIPO in a Taiwan patent application No. 109129448 corresponding to the instant patent application.

English language translation of the following: Office action dated Apr. 22, 2024 from the TIPO in a Taiwan patent application No. 109121462 corresponding to the instant patent application.

English language translation of the following: Office action dated Jun. 4, 2024, from the JPO in a Japanese patent application No. 2023-026563 corresponding to the instant patent application.

Non-Final Office Action issued by USPTO on Jun. 27, 2024, in related U.S. Appl. No. 17/409,692.

Greenhouse, Robert et al., "Synthesis of Alkylpyrroles by the Sodium Borohydride Reduction of Acylpyrroles", Journal of Organic Chemistry, vol. 50, No. 16, Jan. 1, 1985, pp. 2961-2965, Retrieved from URL:https://pubs.acs.org/doi/pdf/10.1021/j000216a030>.

Murali, Maluvadi G. et al., "Thiophene-based donor-acceptor conjugated polymer as potential optoelectronic and photonic material", Journal of Chemistry Science, Indian Academy of Sciences, Springer New Delhi, India, vol. 125, No. 2, Mar. 2013, pp. 247-257.

Niebel, Claude et al., "Bridged 3,3'''-didodecylquaterthiophene-based dimers: design, synthesis, and optoelectronic properties, Tetrahedron, Elsevier, Science Publishers, Amsterdam, NL, vol. 68, No. 27, Apr. 2012, pp. 5599-5605.

Murashima, T. et al., "Highly Soluble Poly (1,3, 4-trisubstituted-2,5-pyrrolenevinylenes)", Tetrahedron Letters, Elsevier, Amsterdam, NL, vol. 39, No. 30, Jul. 23, 1998, pp. 5397-5400.

Gypser, Andreas et al., "The solvent dependence of the diastereoselective hydrogenation of 2- and 2,5-substituted furylcarbinols on a Raney nickel contact", Synthesis, No. 3, Jan. 1, 1996, pp. 349-352.

Extended European Search Report dated Feb. 18, 2022, issued in corresponding EP Patent Application No. 20763894.1.

Final Office Action issued by USPTO on Aug. 15, 2024, in related U.S. Appl. No. 17/409,692.

English language translation of the following: Office action dated Nov. 19, 2024 from the TIPO in a Taiwan patent application No. 109106390 corresponding to the instant patent application.

English language translation of the following: Office action dated Jan. 7, 2025 from the JPO in a Japanese patent application No. 2023-191159 corresponding to the instant patent application.

Restriction Requirement issued by USPTO on Feb. 14, 2025, in related application U.S. Appl. No. 17/558,540.

Ryall, R. P. et al. "Substituted Vitamin K Epoxide Analogues. New Competitive Inhibitors and Substrates of Vitamin K1 Epoxide Reductase" J. Med. Chem. 1990, 33, 1790-1797 (Year: 1990).

Machine translation of WO1997032837A1, Sep. 12, 1997, pp. 1-59 (Year: 1997).

Non-Final Office Action issued by USPTO on Apr. 15, 2025, in related U.S. Appl. No. 17/558,540.

Non-Final Office Action issued by USPTO on Mar. 13, 2025, in related U.S. Appl. No. 17/679,104.

Ryan, H. et al., "Montanic Acid and its Derivatives", Proc. Roy. Irish Acad. 1913, 30, 97-105; Abstract only and CAS registry obtained from SciFinder (Year: 1913).

Final Office Action issued by USPTO on Sep. 4, 2025, in related U.S. Appl. No. 17/558,540.

Notice to file corrected application papers issued by USPTO on Sep. 3, 2025, in related U.S. Appl. No. 17/679,104.

English language translation of the following: Office action dated Sep. 30, 2025 from the JPO in a Japanese patent application No. 2024-152735 corresponding to the instant patent application.

\* cited by examiner

METHOD FOR PRODUCING PEPTIDE COMPOUND, PROTECTIVE GROUP-FORMING REAGENT, AND CONDENSED POLYCYCLIC AROMATIC HYDROCARBON COMPOUND

CROSS-REFERENCE TO RELATED APPLICATIONS

This application is a Continuation of International Application No. PCT/JP2020/007477 filed on Feb. 25, 2020, which claims priority to Japanese Patent Application No. 2019-035853 filed on Feb. 28, 2019. The entire contents of these applications are incorporated herein by reference.

BACKGROUND OF THE INVENTION

1. Field of the Invention

The present disclosure relates to a method for producing a peptide compound, a protective group-forming reagent, and a condensed polycyclic aromatic hydrocarbon compound.

2. Description of the Related Art

A method for producing peptide has been roughly divided into a solid phase method and a liquid phase method.

The solid phase method is advantageous in that isolation and purification after reaction can be performed by only washing resin. However, the solid phase method is associated with problems in that the reaction is essentially a heterogeneous phase reaction, a reaction agent or a reagent need to be used in excess to compensate for the low reactivity, and tracing of the reaction and analysis of a reaction product supported by a carrier are difficult.

On the other hand, the liquid phase method is advantageous in that good reactivity is exhibited, and intermediate peptide can be purified by extraction and washing, isolation, and the like after a condensation reaction. However, the liquid phase method is associated with problems in that the production step is complicated because, in each step of coupling reaction and deprotection, an extraction and washing step with a nonpolar organic solvent and an acidic or basic aqueous solution, or an isolation and purification step such as crystallization is needed to remove a residual reagent or a by-product.

In addition, as a protective group-forming reagent in the related art, an alkoxy-substituted benzyl alcohol compound disclosed in WO2007/034812A is known.

SUMMARY OF THE INVENTION

An object to be achieved by an embodiment of the present invention is to provide a method for producing a peptide compound having an excellent yield.

An object to be achieved by another embodiment of the present invention is to provide a protective group-forming reagent having an excellent yield.

An object to be achieved by still another embodiment of the present invention is to provide a novel condensed polycyclic aromatic hydrocarbon compound.

The methods for achieving the above-described objects include the following aspects.

<1> A method for producing a peptide compound, comprising:
a step of using a condensed polycyclic aromatic hydrocarbon compound represented by Formula (1).

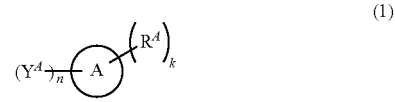

In Formula (1), a ring A represents a condensed polycyclic aromatic hydrocarbon ring, $Y^A$'s each independently represent $-CH_2OH$, $-CH_2NHR$, $-CH_2SH$, or $-CH_2X^0$, where R represents a hydrogen atom, an alkyl group, or an aralkyl group, and $X^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 12 or more, and the ring A may further have a substituent in addition to $Y^A$ and $R^A$.

<2> The method for producing a peptide compound according to <1>,
in which the step of using the condensed polycyclic aromatic hydrocarbon compound represented by Formula (1) is a C-terminal protecting step of protecting a carboxy group or an amide group of an amino acid compound or a peptide compound with the condensed polycyclic aromatic hydrocarbon compound represented by Formula (1).

<3> The method for producing a peptide compound according to <2>,
in which the amino acid compound or the peptide compound in the C-terminal protecting step is an N-terminal protected amino acid compound or an N-terminal protected peptide compound.

<4> The method for producing a peptide compound according to <3>, further comprising:
an N-terminal deprotecting step of deprotecting an N-terminal end of an N-terminal and C-terminal protected amino acid compound or an N-terminal and C-terminal protected peptide compound, which is obtained in the C-terminal protecting step; and
a peptide chain extending step of condensing the N-terminal end of a C-terminal protected amino acid compound or a C-terminal protected peptide compound, which is obtained in the N-terminal deprotecting step, with an N-terminal protected amino acid compound or an N-terminal protected peptide compound.

<5> The method for producing a peptide compound according to <4>, further comprising:
a precipitating step of precipitating an N-terminal and C-terminal protected peptide compound obtained in the peptide chain extending step.

<6> The method for producing a peptide compound according to <5>, further comprising, one or more times in the following order after the precipitating step:
a step of deprotecting an N-terminal end of the obtained N-terminal and C-terminal protected peptide compound;
a step of condensing the N-terminal end of the obtained C-terminal protected peptide compound with an N-terminal protected amino acid compound or an N-terminal protected peptide compound; and
a step of precipitating the obtained N-terminal and C-terminal protected peptide compound.

<7> The method for producing a peptide compound according to any one of <1> to <6>, further comprising:
  a C-terminal deprotecting step of deprotecting a C-terminal protective group.
<8> The method for producing a peptide compound according to any one of <1> to <7>,
  in which the ring A is a naphthalene ring.
<9> The method for producing a peptide compound according to any one of <1> to <8>,
  in which a total number of carbon atoms in all aliphatic hydrocarbon groups included in all $R^A$'s is 36 to 80.
<10> The method for producing a peptide compound according to any one of <1> to <9>,
  in which the condensed polycyclic aromatic hydrocarbon compound represented by Formula (1) is a compound represented by any of Formula (10), Formula (20), or Formula (30).

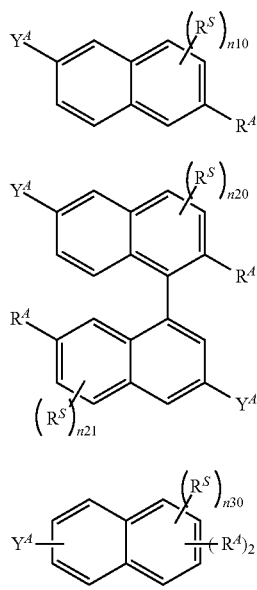

In Formula (10), Formula (20), and Formula (30), $Y^A$'s each independently represent —CH$_2$OH, —CH$_2$NHR, —CH$_2$SH, or —CH$_2$X$^0$, where R represents a hydrogen atom, an alkyl group, or an aralkyl group, and X$^0$ represents Cl, Br, or I, $R^A$'s each independently represent an aliphatic hydrocarbon group or an organic group having an aliphatic hydrocarbon group, the number of carbon atoms in at least one aliphatic hydrocarbon group included in at least one $R^A$ is 12 or more, $R^S$'s each independently represent a substituent, n10 represents an integer of 0 to 6, and n20, n21, and n30 each independently represent an integer of 0 to 5.

<11> The method for producing a peptide compound according to <10>,
  in which $R^A$'s in Formula (10), Formula (20), or Formula (30) are each independently a group represented by Formula (f1) or Formula (a1).

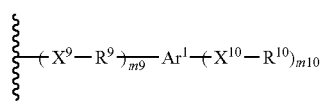

In Formula (f1), a wavy line portion represents a bonding position to a naphthalene ring, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, Ar$^1$ represents an (m10+1)-valent aromatic group or an (m10+1)-valent heteroaromatic group, m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

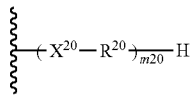

In Formula (a1), a wavy line portion represents a bonding position to a naphthalene ring, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group.

<12> The method for producing a peptide compound according to <11>,
  in which the group represented by Formula (f1) is a group represented by Formula (f2).

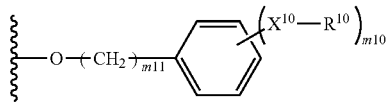

In Formula (f2), a wavy line portion represents a bonding position to a naphthalene ring, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

<13> The method for producing a peptide compound according to <11>,
  in which $X^{20}$ in Formula (a1), which is bonded to the naphthalene ring, is —O—.
<14> A protective group-forming reagent comprising:
  a condensed polycyclic aromatic hydrocarbon compound represented by Formula (1).

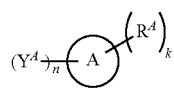

In Formula (1), a ring A represents a condensed polycyclic aromatic hydrocarbon ring, $Y^A$'s each independently represent —CH$_2$OH, —CH$_2$NHR, —CH$_2$SH, or —CH$_2$X$^0$, where R represents a hydrogen atom, an alkyl group, or an aralkyl group, and $X^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 12 or more, and the ring A may further have a substituent in addition to $Y^A$ and $R^A$.

<15> The protective group-forming reagent according to <14>,
in which the protective group-forming reagent is a protective group-forming reagent of a carboxy group or an amide group.

<16> The protective group-forming reagent according to <14> or <15>,
in which the protective group-forming reagent is a C-terminal protective group-forming reagent of an amino acid compound or a peptide compound.

<17> A condensed polycyclic aromatic hydrocarbon compound represented by Formula (1a).

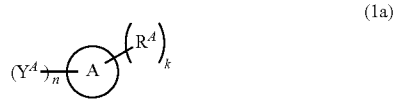
(1a)

In Formula (1a), a ring A represents a condensed polycyclic aromatic hydrocarbon ring, $Y^A$'s each independently represent —CH$_2$OH, —CH$_2$NHR, —CH$_2$SH, or —CH$_2$X$^0$, where R represents a hydrogen atom, an alkyl group, or an aralkyl group, and $X^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 18 or more, and the ring A may further have a substituent in addition to $Y^A$ and $R^A$.

<18> The condensed polycyclic aromatic hydrocarbon compound according to <17>,
in which the ring A is a naphthalene ring.

<19> The condensed polycyclic aromatic hydrocarbon compound according to <17> or <18>,
in which a total number of carbon atoms in all aliphatic hydrocarbon groups included in all $R^A$'s is 36 to 80.

<20> The condensed polycyclic aromatic hydrocarbon compound according to any one of <17> to <19>,
in which the condensed polycyclic aromatic hydrocarbon compound represented by Formula (1a) is a compound represented by any of Formula (10a), Formula (20a), or Formula (30a).

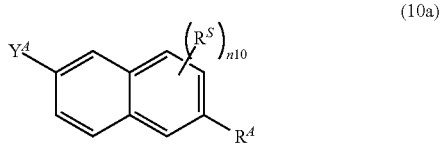
(10a)

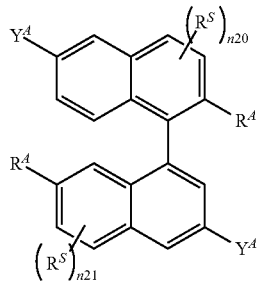
(20a)

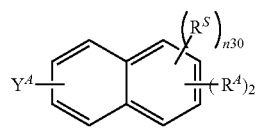
(30a)

In Formula (10a), Formula (20a), and Formula (30a), $Y^A$'s each independently represent —CH$_2$OH, —CH$_2$NHR, —CH$_2$SH, or —CH$_2$X$^0$, where R represents a hydrogen atom, an alkyl group, or an aralkyl group, and $X^0$ represents Cl, Br, or I, $R^A$'s each independently represent an aliphatic hydrocarbon group or an organic group having an aliphatic hydrocarbon group, the number of carbon atoms in at least one aliphatic hydrocarbon group included in at least one $R^A$ is 18 or more, $R^S$'s each independently represent a substituent, n10 represents an integer of 0 to 6, and n20, n21, and n30 each independently represent an integer of 0 to 5.

<21> The condensed polycyclic aromatic hydrocarbon compound according to <20>,
in which $R^A$'s in Formula (10a), Formula (20a), or Formula (30a) are each independently a group represented by Formula (f1) or Formula (a1).

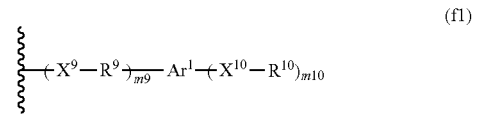
(f1)

In Formula (f1), a wavy line portion represents a bonding position to a naphthalene ring, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

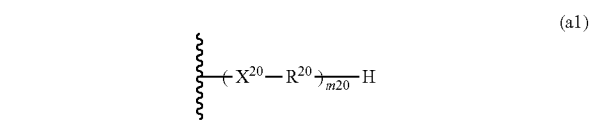
(a1)

In Formula (a1), a wavy line portion represents a bonding position to a naphthalene ring, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group.

<22> The condensed polycyclic aromatic hydrocarbon compound according to <21>,
in which the group represented by Formula (f1) is a group represented by Formula (f2).

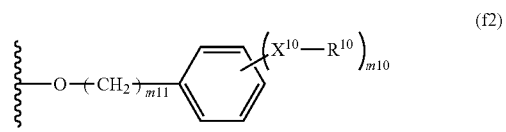

(f2)

In Formula (f2), a wavy line portion represents a bonding position to a naphthalene ring, m10 represents an integer of 1 to 3, m 11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

<23> The condensed polycyclic aromatic hydrocarbon compound according to <21>,
in which $X^{20}$ in Formula (a1), which is bonded to the naphthalene ring, is —O—.

According to an embodiment of the present invention, it is possible to provide a method for producing a peptide compound having an excellent yield.

In addition, according to another embodiment of the present invention, it is possible to provide a protective group-forming reagent having an excellent yield.

In addition, according to still another embodiment of the present invention, it is possible to provide a novel condensed polycyclic aromatic hydrocarbon compound.

DESCRIPTION OF THE PREFERRED EMBODIMENTS

Hereinafter, the contents of the present disclosure will be described in detail. The description of constituent elements below is made based on representative embodiments of the present disclosure in some cases, but the present disclosure is not limited to such embodiments.

In addition, in the present specification, a numerical range represented using "to" means a range including numerical values described before and after the preposition "to" as a lower limit value and an upper limit value.

In numerical ranges described in stages in the present specification, an upper limit value or a lower limit value described in one numerical range may be replaced with an upper limit value or a lower limit value of a numerical range described in another stage. In addition, in the numerical ranges described in the present specification, the upper limit value or the lower limit value of the numerical ranges may be replaced with the values shown in examples.

In the present specification, the term "step" includes not only the independent step but also a step in which intended purposes are achieved even in a case where the step cannot be precisely distinguished from other steps.

In a case where substitution or unsubstitution is not noted in regard to the notation of a "group" (atomic group) in the present specification, the "group" includes not only a group not having a substituent but also a group having a substituent. For example, the concept of an "alkyl group" includes not only an alkyl group not having a substituent (unsubstituted alkyl group) but also an alkyl group having a substituent (substituted alkyl group).

In addition, a chemical structural formula in the present specification may be described by a simplified structural formula in which hydrogen atoms are omitted.

In the present disclosure, "% by mass" has the same definition as that for "% by weight", and "part by mass" has the same definition as that for "part by weight".

In addition, in the present disclosure, a combination of two or more preferred aspects is a more preferred aspect.

(Method for Producing Peptide Compound)

The method for producing a peptide compound according to the embodiment of the present disclosure includes a step of using a condensed polycyclic aromatic hydrocarbon compound represented by Formula (1) (hereinafter, also referred to as a compound represented by Formula (1)).

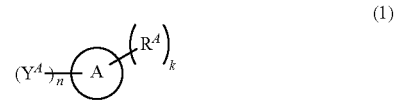

(1)

In Formula (1), a ring A represents a condensed polycyclic aromatic hydrocarbon ring, $Y^A$'s each independently represent —CH$_2$OH, —CH$_2$NHR, —CH$_2$SH, or —CH$_2$X$^0$, where R represents a hydrogen atom, an alkyl group, or an aralkyl group, and $X^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 12 or more, and the ring A may further have a substituent in addition to $Y^A$ and $R^A$.

Since, in the compound represented by Formula (1) according to the present disclosure, the number of carbon atoms in at least one aliphatic hydrocarbon group included in at least one $R^A$ is 12 or more, a compound protected by Formula (1) has excellent solubility in a hydrophobic solvent. Furthermore, with regard to a hydrophilic solvent, since the aliphatic hydrocarbon groups in each $R^A$ aggregate with each other and the compound represented by Formula (1) has a condensed polycyclic aromatic hydrocarbon ring, due to the π-π interaction (π-π stacking) between the condensed polycyclic aromatic hydrocarbon ring, crystallization property is excellent, and purification and separability are also excellent. In other words, in a case where the compound protected by Formula (1) is subjected to a reaction, since the compound has excellent solubility in a hydrophobic solvent as a reaction solvent, it is presumed that the reaction proceeds rapidly, and since a target product is efficiently crystallized and purified by adding a polar solvent which is a poor solvent during purification, it is presumed that yield of the obtained compound (peptide compound and the like) is excellent.

The above-described effects are more excellent in a case where the number of carbon atoms in at least one aliphatic hydrocarbon group included in at least one $R^A$ is 18 or more. The reason is presumed that, as the number of carbon atoms increases, the contribution ratio of hydrophobicity in the entire molecule increases, which makes it easier to dissolve in a hydrophobic solvent, and with regard to a hydrophilic solvent, presumed that, as the number of carbon atoms increases, the cohesive force increases, which makes it easier to be crystallized.

In addition, since the compound represented by Formula (1) according to the present disclosure has $Y^A$ bonded to the condensed polycyclic aromatic hydrocarbon ring, the compound represented by Formula (1) has a higher deprotection rate than a benzyl alcohol-type protective group-forming reagent in the related art. It is presumed that this is because the condensed polycyclic aromatic hydrocarbon ring has better electron donating property than the benzyl alcohol. With the compound represented by Formula (1) according to the present disclosure, it is possible to selectively deprotect only the C-terminal protective group while leaving a protective group of an amino acid side chain, that is, to distinguish the side chain protective group from each amino acid. It can also be used for subsequent reactions such as a condensation reaction of a fragment of a long-chain peptide with the deprotected C-terminal end. In addition, in a case of peptide which is unstable to a strong acid, decomposition of a peptide chain can be suppressed, which leads to an improvement in yield. In addition, it is suitable for the synthesis of peptide which is unstable to acid because of its excellent deprotection rate with acid.

Hereinafter, the method for producing a peptide compound according to the embodiment of the present disclosure will be described in detail.

In the method for producing a peptide compound according to the embodiment of the present disclosure, the condensed polycyclic aromatic hydrocarbon compound represented by Formula (1) can be used not only for formation of a protective group, but also for denaturation of a peptide compound, adjustment of solubility in water or an organic solvent, improvement of crystallinity, multimerization, and the like.

Among these, the condensed polycyclic aromatic hydrocarbon compound represented by Formula (1) is preferably used for formation of a protective group, and more preferably used for forming a C-terminal protective group in an amino acid compound or a peptide compound.

<Condensed Polycyclic Aromatic Hydrocarbon Compound Represented by Formula (1)>

The condensed polycyclic aromatic hydrocarbon compound represented by Formula (1) according to the present disclosure is shown below.

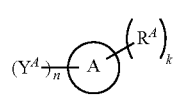

(1)

In Formula (1), the ring A, $Y^A$, $R^A$, n, and k have the same meanings as described above.

The ring A in Formula (1) represents a condensed polycyclic aromatic hydrocarbon ring in which two or more aromatic hydrocarbon rings are condensed, and the ring A may further have a substituent in addition to $Y^A$ and $R^A$.

From the viewpoint of deprotection rate, crystallization property, and yield, the ring A is preferably a condensed polycyclic aromatic hydrocarbon ring having 2 to 4 rings, more preferably a condensed polycyclic aromatic hydrocarbon ring having 2 or 3 rings, and particularly preferably a condensed polycyclic aromatic hydrocarbon ring having 2 rings.

Among these, from the viewpoint of deprotection rate, crystallization property, and yield, the ring A is preferably a naphthalene ring, an anthracene ring, a phenanthrene ring, a tetracene ring, a triphenylene ring, a pyrene ring, or a chrysene ring, more preferably a naphthalene ring, an anthracene ring, or a phenanthrene ring, and particularly preferably a naphthalene ring.

In addition, from the viewpoint of yield, the ring A is preferably a ring having at least a structure (naphthalene ring structure) in which two benzene rings are fused.

Furthermore, the ring A may have a substituent, and as described later, may form a ring structure in which two or more substituents are bonded to each other, and the ring A may have a structure in which an aliphatic hydrocarbon ring, an aliphatic hetero ring, a heteroaromatic ring, or the like is further fused.

From the viewpoint of deprotection rate, solubility in a solvent, and yield, $Y^A$'s in Formula (1) are each independently preferably —$CH_2OH$, —$CH_2NHR$, or —$CH_2SH$, more preferably —$CH_2OH$ or —$CH_2NHR$, and particularly preferably —$CH_2OH$. In addition, from the viewpoint of mild reaction conditions, $Y^A$ is preferably —$CH_2OH$ or —$CH_2SH$ and more preferably —$CH_2OH$.

In addition, in Formula (1), in a case of having two $Y^A$'s, it is preferable that the two $Y^A$'s have the same group.

n in Formula (1) is preferably 1.

Examples of the alkyl group in R include an alkyl group having 1 to 30 carbon atoms (also referred to as "the number of carbon atoms"), and an alkyl group having 1 to 10 carbon atoms is preferable and an alkyl group having 1 to 6 carbon atoms is more preferable. Suitable specific examples thereof include a methyl group, an ethyl group, a propyl group, an isopropyl group, an n-butyl group, an isobutyl group, a sec-butyl group, a tert-butyl group, a pentyl group, and a hexyl group, and a methyl group or an ethyl group is more preferable.

Examples of the aralkyl group (also referred to as an "arylalkyl group") in R include an aralkyl group having 7 to 30 carbon atoms, and an aralkyl group having 7 to 20 carbon atoms is preferable and an aralkyl group having 7 to 16 carbon atoms (for example, a group in which an alkylene group having 1 to 6 carbon atoms is bonded to an aryl group having 6 to 10 carbon atoms) is more preferable. Suitable specific examples thereof include a benzyl group, a 1-phenylethyl group, a 2-phenylethyl group, a 1-phenylpropyl group, a naphthylmethyl group, a 1-naphthylethyl group, and a 1-naphthylpropyl group, and a benzyl group is more preferable.

Among these, R is preferably a hydrogen atom, an alkyl group having 1 to 6 carbon atoms, or an aralkyl group having 7 to 16 carbon atoms, more preferably a hydrogen atom, a methyl group, an ethyl group, or a benzyl group, and still more preferably a hydrogen atom.

In addition, as the above-described substituent on the ring A or $R^A$, the compound represented by Formula (1) may have a group having the ring A, $Y^A$, and $R^A$, or a group having the ring A and $Y^A$. That is, the compound represented by Formula (1) may be a multimer such as a dimer. From the viewpoint of ease of synthesis, the multimer is preferably a dimer to a hexamer, more preferably a dimer to a tetramer, and particularly preferably a dimer.

From the viewpoint of deprotection rate, solubility in a solvent, and yield, k, which is the number of substitutions of $R^A$ on the ring A in Formula (1), is preferably an integer of 1 to 4, more preferably an integer of 1 to 3, and particularly preferably 1 or 2.

$R^A$'s each independently represent an aliphatic hydrocarbon group or an organic group having an aliphatic hydrocarbon group, where the number of carbon atoms in at least one aliphatic hydrocarbon group included in at least one $R^A$ is 12 or more.

The "aliphatic hydrocarbon group" is a linear, branched, or cyclic saturated or unsaturated aliphatic hydrocarbon group, and an aliphatic hydrocarbon group having 5 or more carbon atoms is preferable, an aliphatic hydrocarbon group having 5 to 60 carbon atoms is more preferable, an aliphatic hydrocarbon group having 5 to 30 carbon atoms is still more preferable, and an aliphatic hydrocarbon group having 10 to 30 carbon atoms is particularly preferable.

In the present specification, the "organic group having an aliphatic hydrocarbon group" in $R^A$ is a monovalent (one bonding site bonded to the ring A) organic group having an aliphatic hydrocarbon group in its molecular structure.

The moiety of the "aliphatic hydrocarbon group" in the "organic group having an aliphatic hydrocarbon group" is not particularly limited, and may be present at the terminal (a monovalent group) or may be present at any other site (for example, a divalent group).

Examples of the "aliphatic hydrocarbon group" include an alkyl group, a cycloalkyl group, an alkenyl group, and an alkynyl group.

Specific examples thereof include monovalent groups such as a methyl group, an ethyl group, a propyl group, an isopropyl group, a butyl group, an isobutyl group, a sec-butyl group, a tert-butyl group, a pentyl group, a hexyl group, an octyl group, a decyl group, a lauryl group, a tridecyl group, a myristyl group, a cetyl group, a stearyl group, an aralkyl group, a behenyl group, an oleyl group, and an isostearyl group; divalent groups derived from these (divalent groups obtained by removing one hydrogen atom from the monovalent groups); and groups removing a hydroxyl group or the like from various steroid groups.

As the "alkyl group", for example, an alkyl group having 1 to 6 carbon atoms, or the like is preferable, and examples thereof include methyl, ethyl, propyl, isopropyl, butyl, isobutyl, sec-butyl, tert-butyl, pentyl, and hexyl.

As the "cycloalkyl group", for example, a cycloalkyl group having 3 to 6 carbon atoms, or the like is preferable, and examples thereof include cyclopropyl, cyclobutyl, cyclopentyl, and cyclohexyl. In addition, these may be linked repeatedly.

As the "alkenyl group", for example, an alkenyl group having 2 to 6 carbon atoms, or the like is preferable, and examples thereof include vinyl, 1-propenyl, allyl, isopropenyl, butenyl, and isobutenyl.

As the "alkynyl group", for example, an alkynyl group having 2 to 6 carbon atoms, or the like is preferable, and examples thereof include ethynyl, propargyl, and 1-propynyl.

As the "steroid group", for example, cholesterol, estradiol, or the like is preferable.

The above-described substituent may be further substituted with a silyl group, a hydrocarbon group having a silyloxy structure, or an organic group having a perfluoroalkyl structure.

As the above-described silyl group, a trialkylsilyl group is preferable, and a silyl group having three alkyl groups having 1 to 3 carbon atoms is more preferable.

As the silyloxy structure in the above-described hydrocarbon group having a silyloxy structure, a trialkylsilyloxy structure is preferable, and a silyloxy structure having three alkyl groups having 1 to 3 carbon atoms is more preferable.

In addition, the above-described hydrocarbon group having a silyloxy structure preferably has 1 to 3 silyloxy structures.

Furthermore, the number of carbon atoms in the above-described hydrocarbon group having a silyloxy structure is preferably 10 or more, more preferably 10 to 100, and particularly preferably 16 to 50.

Preferred examples of the above-described hydrocarbon group having a silyloxy structure include a group represented by Formula (Si).

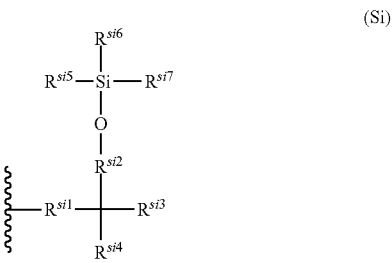

In Formula (Si), $R^{si1}$ represents a single bond or an alkylene group having 1 to 3 carbon atoms, $R^{si2}$ represents an alkylene group having 1 to 3 carbon atoms, $R^{si3}$ and $R^{si4}$ each independently represent a hydrogen atom, an alkyl group having 1 to 6 carbon atoms, or $-OSiR^{si5}R^{si6}R^{si7}$, and $R^{si5}$ to $R^{si7}$ each independently represent an alkyl group having 1 to 6 carbon atoms or an aryl group.

$R^{si5}$ to $R^{si7}$ in Formula (Si) are each independently preferably an alkyl group having 1 to 6 carbon atoms or a phenyl group, more preferably an alkyl group having 1 to 6 carbon atoms, and particularly preferably a linear or branched alkyl group having 1 to 4 carbon atoms.

As the perfluoroalkyl structure in the above-described organic group having a perfluoroalkyl structure, a perfluoroalkyl structure having 1 to 20 carbon atoms is preferable, a perfluoroalkyl structure having 5 to 20 carbon atoms is more preferable, and a perfluoroalkyl structure having 7 to 16 carbon atoms is particularly preferable. In addition, the above-described perfluoroalkyl structure may be linear, may have a branch, or may have a ring structure.

The above-described organic group having a perfluoroalkyl structure is preferably a perfluoroalkyl group, an alkyl group having a perfluoroalkyl structure, or an alkyl group having a perfluoroalkyl structure and an amide bond in the alkyl chain.

The number of carbon atoms in the above-described organic group having a perfluoroalkyl structure is preferably 5 or more, more preferably 10 or more, still more preferably 10 to 100, and particularly preferably 16 to 50.

Preferred examples of the above-described organic group having a perfluoroalkyl structure include groups shown below.

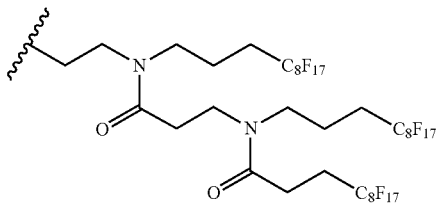

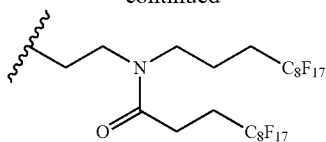

A moiety other than the "aliphatic hydrocarbon group" in the "organic group having an aliphatic hydrocarbon group" can be optionally set. For example, the "organic group having an aliphatic hydrocarbon group" may have a moiety such as —O—, —S—, —COO—, —OCONH—, —CONH—, and a hydrocarbon group (monovalent group or divalent group) other than the "aliphatic hydrocarbon group".

Examples of the "hydrocarbon group" other than the "aliphatic hydrocarbon group" include an aromatic hydrocarbon group, and specifically, for example, a monovalent group such as an aryl group or a divalent group derived from the monovalent group is used.

As the "aryl group", for example, an aryl group having 6 to 14 carbon atoms is preferable, and examples thereof include phenyl, 1-naphthyl, 2-naphthyl, biphenylyl, and 2-anthryl. Among these, an aryl group having 6 to 10 carbon atoms is more preferable, and phenyl is particularly preferable.

In addition, the above-described aliphatic hydrocarbon group and the hydrocarbon group other than the above-described aliphatic hydrocarbon group may be substituted with a substituent selected from a halogen atom (chlorine atom, bromine atom, fluorine atom, or iodine atom), an oxo group, and the like.

The bond (substitution) of the "organic group having an aliphatic hydrocarbon group" to the ring A may be through the above-described "aliphatic hydrocarbon group" or the above-described "hydrocarbon group" existing in $R^A$, that is, may be directly bonded by a carbon-carbon bond, or may be through a moiety such as —O—, —S—, —COO—, —OCONH—, and —CONH—, which exists in $R^A$. From the viewpoint of ease of synthesizing the compound, it is preferable to be through —O—, —S—, —COO—, or —CONH—, and it is particularly preferable to be through —O—.

In the compound represented by Formula (1) according to the present disclosure, from the viewpoint of solubility in a solvent, crystallization property, and yield, the total number of carbon atoms in all aliphatic hydrocarbon groups included in all $R^A$'s is preferably 24 or more, more preferably 24 to 200, still more preferably 32 to 100, particularly preferably 34 to 80, and most preferably 36 to 80.

In addition, the compound represented by Formula (1) according to the present disclosure is a compound which has at least one aliphatic hydrocarbon group having 12 or more carbon atoms in at least one $R^A$. From the viewpoint of solubility in a solvent, crystallization property, and yield, a compound which has at least one aliphatic hydrocarbon group having 12 to 100 carbon atoms in at least one $R^A$ is preferable, a compound which has at least one aliphatic hydrocarbon group having 18 to 40 carbon atoms in at least one $R^A$ is more preferable, and a compound which has at least one aliphatic hydrocarbon group having 20 to 36 carbon atoms in at least one $R^A$ is still more preferable.

Furthermore, from the viewpoint of crystallization property and yield, the above-described aliphatic hydrocarbon group is preferably an alkyl group and more preferably a linear alkyl group.

In addition, from the viewpoint of solubility in a solvent, crystallization property, and yield, the number of carbon atoms in one $R^A$ is preferably 12 to 200, more preferably 18 to 150, still more preferably 18 to 100, and particularly preferably 20 to 80, respectively.

In Formula (1), from the viewpoint of solubility in a solvent, crystallization property, and yield, it is preferable that at least one $R^A$ is a group represented by any of Formula (f1), Formula (a1), Formula (b1), or Formula (e1), it is more preferable to be a group represented by Formula (f1) or Formula (a1), and it is particularly preferable to be a group represented by Formula (f1).

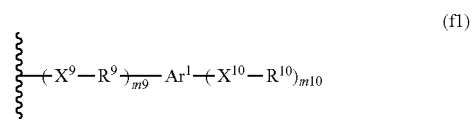

(f1)

In Formula (f1), a wavy line portion represents a bonding position to a naphthalene ring, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^J$ represents an (m10+1)-valent aromatic group or an (m10+1)-valent heteroaromatic group, m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

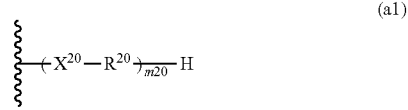

(a1)

In Formula (a1), a wavy line portion represents a bonding position to a naphthalene ring, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group.

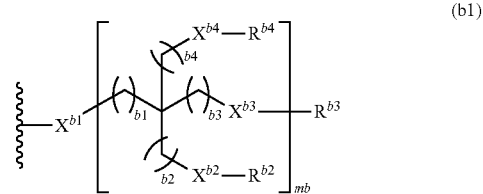

(b1)

In Formula (b1), a wavy line portion represents a bonding position to the ring A, mb represents 1 or 2, b1 to b4 each independently represent an integer of 0 to 2, $X^{b1}$ to $X^{b4}$ each independently represent a single bond, —O—, —S—, —COO—, —OCONH—, or —CONH—, $R^{b2}$ and $R^{b4}$ each independently represent a hydrogen atom, a methyl group, or an aliphatic hydrocarbon group having 5 or more carbon atoms, and $R^{b3}$ represents an aliphatic hydrocarbon group having 5 or more carbon atoms.

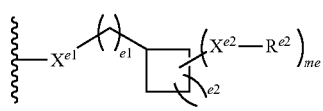
(e1)

In Formula (e1), a wavy line portion represents a bonding position to the ring A, $X^{e1}$ represents a single bond, —O—, —S—, —NHCO—, or —CONH—, me represents an integer of 0 to 15, e1 represents an integer of 0 to 11, e2 represents an integer of 0 to 5, $X^{e2}$'s each independently represent a single bond, —O—, —S—, —COO—, —OCONH—, —NHCO—, or —CONH—, and $R^{e2}$'s each independently represent a hydrogen atom, a methyl group, or an organic group having an aliphatic hydrocarbon group having 5 or more carbon atoms.

m9 in Formula (f1) is preferably 1 or 2 and more preferably 1.

$X^9$ and $X^{10}$ in Formula (f1) are each independently preferably —O—, —S—, —COO—, —OCONH—, or —CONH—, and more preferably —O—.

$R^9$'s in Formula (f1) are each independently preferably an alkylene group having 1 to 10 carbon atoms, more preferably an alkylene group having 1 to 4 carbon atoms, and particularly preferably a methylene group.

$R^{10}$'s in Formula (f1) are each independently preferably a monovalent aliphatic hydrocarbon group having 5 to 60 carbon atoms, more preferably a monovalent aliphatic hydrocarbon group having 12 to 50 carbon atoms, still more preferably a monovalent aliphatic hydrocarbon group having 18 to 40 carbon atoms, and particularly preferably a monovalent aliphatic hydrocarbon group having 20 to 32 carbon atoms. In addition, $R^{10}$'s are each independently preferably a linear alkyl group or a branched alkyl group and more preferably a linear alkyl group.

m10 in Formula (f1) is preferably 2 or 3 and more preferably 2.

$Ar^1$ in Formula (f1) is preferably an (m10+1)-valent aromatic group, more preferably a group obtained by removing (m10+1) pieces of hydrogen atoms from benzene or a group obtained by removing (m10+1) pieces of hydrogen atoms from naphthalene, and particularly preferably a group obtained by removing (m10+1) pieces of hydrogen atoms from benzene.

In addition, from the viewpoint of solubility in a solvent, crystallization property, and yield, the group represented by Formula (f1) is preferably a group represented by Formula (f2).

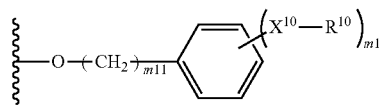
(f2)

In Formula (f2), a wavy line portion represents a bonding position to a naphthalene ring, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

m10, $X^{10}$, and $R^{10}$ in Formula (f2) have the same meanings as m10, $X^{10}$, and $R^{10}$ in Formula (f1), respectively, and the preferred aspects thereof are also the same.

m11 in Formula (f2) is preferably 1 or 2 and more preferably 1.

m20 in Formula (a1) is preferably 1 or 2 and more preferably 1.

$X^{20}$'s in Formula (a1) are each independently preferably —O—, —S—, —COO—, —OCONH—, or —CONH—, and more preferably —O—.

$R^{20}$ in Formula (a1) is preferably a divalent aliphatic hydrocarbon group having 5 or more carbon atoms, more preferably a divalent aliphatic hydrocarbon group having 5 to 60 carbon atoms, still more preferably a divalent aliphatic hydrocarbon group having 8 to 40 carbon atoms, and particularly preferably a divalent aliphatic hydrocarbon group having 12 to 32 carbon atoms. In addition, $R^{20}$ is preferably a linear alkylene group.

mb in Formula (b1) is preferably 1.

b1 to b4 in Formula (b1) are each independently preferably 1 or 2 and more preferably 1.

$X^{b1}$ to $X^{b4}$ in Formula (b1) are each independently preferably —O—, —S—, —COO—, —OCONH—, or —CONH—, and more preferably —O—.

$R^{b2}$ and $R^{b4}$ in Formula (b1) are each independently preferably a hydrogen atom, a methyl group, or an aliphatic hydrocarbon group having 5 to 60 carbon atoms, more preferably a hydrogen atom, a methyl group, or an alkyl group having 8 to 40 carbon atoms, and particularly preferably a hydrogen atom, a methyl group, or an alkyl group having 12 to 32 carbon atoms.

$R^{b3}$ in Formula (b1) is preferably a monovalent aliphatic hydrocarbon group having 5 to 60 carbon atoms, more preferably a monovalent aliphatic hydrocarbon group having 8 to 40 carbon atoms, and particularly preferably a monovalent aliphatic hydrocarbon group having 12 to 32 carbon atoms. In addition, $R^{b3}$ is preferably a linear alkyl group.

In addition, in the compound represented by Formula (1) according to the present disclosure, from the viewpoint of solubility in a solvent and yield, preferred examples of the aliphatic hydrocarbon group in $R^A$ include an aliphatic hydrocarbon group having a branch, and more preferred examples thereof include groups shown below. A wavy line portion represents a bonding position to another structure, nt2 represents an integer of 3 or more, and nt3 represents an integer set such that the total number of carbon atoms in the following group is 14 to 300.

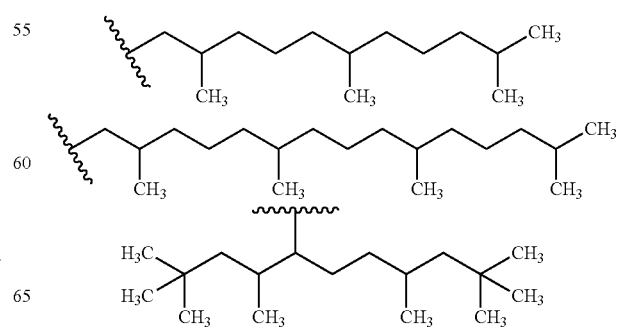

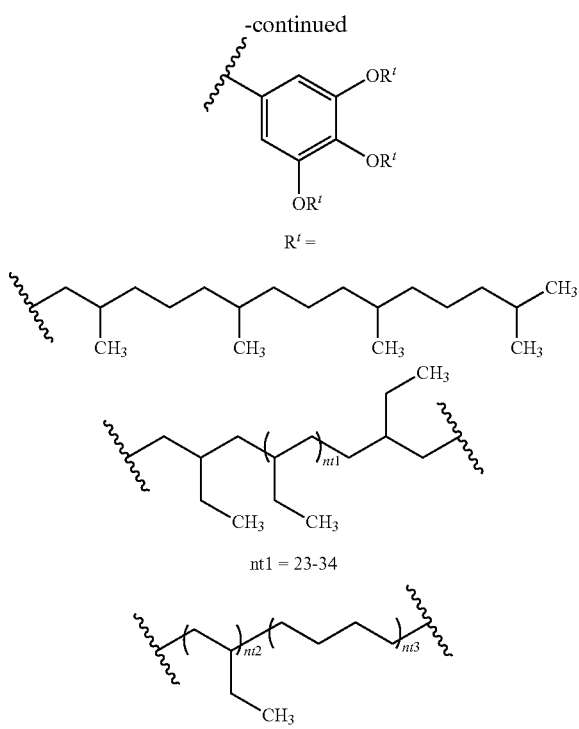

$nt1 = 23-34$

The substituent which may be included in the compound represented by Formula (1) on the ring A is not particularly limited, and examples thereof include an alkoxy group, an aryloxy group, a halogen atom, an alkyl group, a halogenated alkyl group, an aryl group, an acyl group, an acyloxy group, an alkoxycarbonyl group, an allyloxycarbonyl group, an alkylthio group, an arylthio group, $R^{st}$—CO—$NR^{st}$—, —CON($R^{st}$)$_2$, a dialkylamino group, an alkylarylamino group, a diarylamino group, and a group obtained by combining two or more of these groups. $R^{st}$ represents a hydrogen atom, an alkyl group, or an aryl group.

In addition, in a case where the compound represented by Formula (1) is a multimer, preferred examples of the substituent which may be included on the ring A include a group represented by Formula (M).

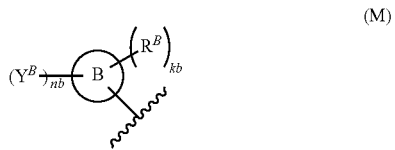

(M)

In Formula (M), a wavy line portion represents a bonding position to the ring A in Formula (1), a ring B represents a condensed polycyclic aromatic hydrocarbon ring, $Y^B$'s each independently represent —CH$_2$OH, —CH$_2$NHR$^b$, —CH$_2$SH, or —CH$_2$X$^0$, where R$^b$ represents a hydrogen atom, an alkyl group, or an aralkyl group, and X$^0$ represents Cl, Br, or I, kb represents an integer of 1 to 5, nb represents 1 or 2, R$^B$'s each independently represent an aliphatic hydrocarbon group or an organic group having an aliphatic hydrocarbon group, the number of carbon atoms included in at least one aliphatic hydrocarbon group included in at least one R$^B$ is 12 or more, and the ring B may further have a substituent in addition to $Y^B$ and R$^B$.

The ring B, $Y^B$, R$^b$, kb, nb, and R$^B$ in Formula (M) have the same meanings as the ring A, $Y^A$, R, k, n, and R$^A$ in Formula (1), respectively, and the preferred aspects thereof are also the same.

In addition, in a case of having the group represented by Formula (M) as a substituent, the compound represented by Formula (1) is preferably a compound represented by Formula (20) described later.

From the viewpoint of deprotection rate, crystallization property, solubility in a solvent, and yield, the condensed polycyclic aromatic hydrocarbon compound represented by Formula (1) is preferably a compound represented by any of Formula (10), Formula (20), or Formula (30), more preferably a compound represented by Formula (10) or Formula (20), and particularly preferably a compound represented by Formula (10).

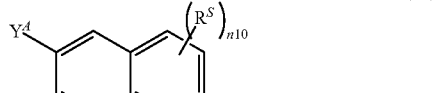

(10)

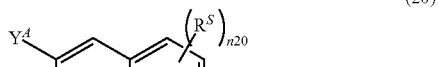

(20)

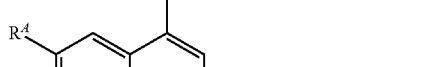

(30)

In Formula (10), Formula (20), and Formula (30), $Y^A$'s each independently represent —CH$_2$OH, —CH$_2$NHR, —CH$_2$SH, or —CH$_2$X$^0$, where R represents a hydrogen atom, an alkyl group, or an aralkyl group, and X$^0$ represents Cl, Br, or I, R$^A$'s each independently represent an aliphatic hydrocarbon group or an organic group having an aliphatic hydrocarbon group, the number of carbon atoms in at least one aliphatic hydrocarbon group in at least one R$^A$ is 12 or more, R$^S$'s each independently represent a substituent, n10 represents an integer of 0 to 6, and n20, n21, and n30 each independently represent an integer of 0 to 5.

$Y^A$ and R$^A$ in Formula (10), Formula (20), or Formula (30) have the same meanings as $Y^A$ and R$^A$ in Formula (1), respectively, and the preferred aspects thereof are also the same.

n10 in Formula (10) is preferably an integer of 0 to 2, more preferably 0 or 1, and particularly preferably 0.

n20 and n21 in Formula (20) are each independently preferably an integer of 0 to 2, more preferably 0 or 1, and particularly preferably 0.

Two $Y^A$'s in Formula (20) preferably have the same group.

In addition, two R$^A$'s in Formula (20) preferably have the same group.

n30 in Formula (30) is preferably an integer of 0 to 2, more preferably 0 or 1, and particularly preferably 0.

Two $R^A$'s in Formula (30) preferably have the same group.

$R^S$'s in Formula (10), Formula (20), or Formula (30) are each independently preferably an alkoxy group, an aryloxy group, a halogen atom, an alkyl group, a halogenated alkyl group, an aryl group, an acyl group, an acyloxy group, an alkoxycarbonyl group, an allyloxycarbonyl group, an alkylthio group, an arylthio group, $R^{st}$—CO—$NR^{st}$—, —CON$(R^{st})_2$, a dialkylamino group, an alkylarylamino group, a diarylamino group, or a group obtained by combining two or more of these groups, more preferably an alkoxy group, an aryloxy group, a halogen atom, an alkyl group, a halogenated alkyl group, or an aryl group, and still more preferably an alkoxy group or an alkyl group.

From the viewpoint of solubility in a solvent, crystallization property, and yield, it is preferable that $R^A$ in Formula (10) is a group represented by any of Formula (f1), Formula (a1), Formula (b1), or Formula (e1) described above, it is more preferable to be a group represented by any of Formula (f1) or Formula (a1) described above, it is still more preferable to be a group represented by Formula (f1) described above, and it is particularly preferable to be a group represented by Formula (f2).

From the viewpoint of solubility in a solvent, crystallization property, and yield, it is preferable that $R^A$'s in Formula (20) are each independently a group represented by any of Formula (f1), Formula (a1), Formula (b1), or Formula (e1) described above, and it is more preferable to be a group represented by any of Formula (f1) or Formula (a1) described above.

From the viewpoint of solubility in a solvent, crystallization property, and yield, it is preferable that $R^A$'s in Formula (30) are each independently a group represented by any of Formula (f1), Formula (a1), Formula (b1), or Formula (e1) described above, and it is more preferable to be a group represented by any of Formula (f1) or Formula (a1) described above.

The molecular weight of the compound represented by Formula (1) is not particularly limited, but from the viewpoint of deprotection rate, crystallization property, solubility in a solvent, and yield, it is preferably 340 to 3,000, more preferably 400 to 2,000, still more preferably 500 to 1,500, and particularly preferably 800 to 1,300. In addition, in a case where the molecular weight is 3,000 or less, the proportion of Formula (1) in the target product is appropriate and the proportion of a compound obtained by deprotecting Formula (1) is not reduced, so that productivity is excellent.

Preferred specific examples of the compound represented by Formula (1) include compounds shown below, but the compound represented by Formula (1) is not limited thereto. $R^g$ represents an aliphatic hydrocarbon group having 12 or more carbon atoms, and an aliphatic hydrocarbon group having 12 to 100 carbon atoms is preferable, an aliphatic hydrocarbon group having 18 to 40 carbon atoms is more preferable, and an aliphatic hydrocarbon group having 20 to 32 carbon atoms is particularly preferable. In addition, the above-described aliphatic hydrocarbon group is preferably a linear alkyl group, a branched alkyl group, or a cyclic alkyl group, and more preferably a linear alkyl group.

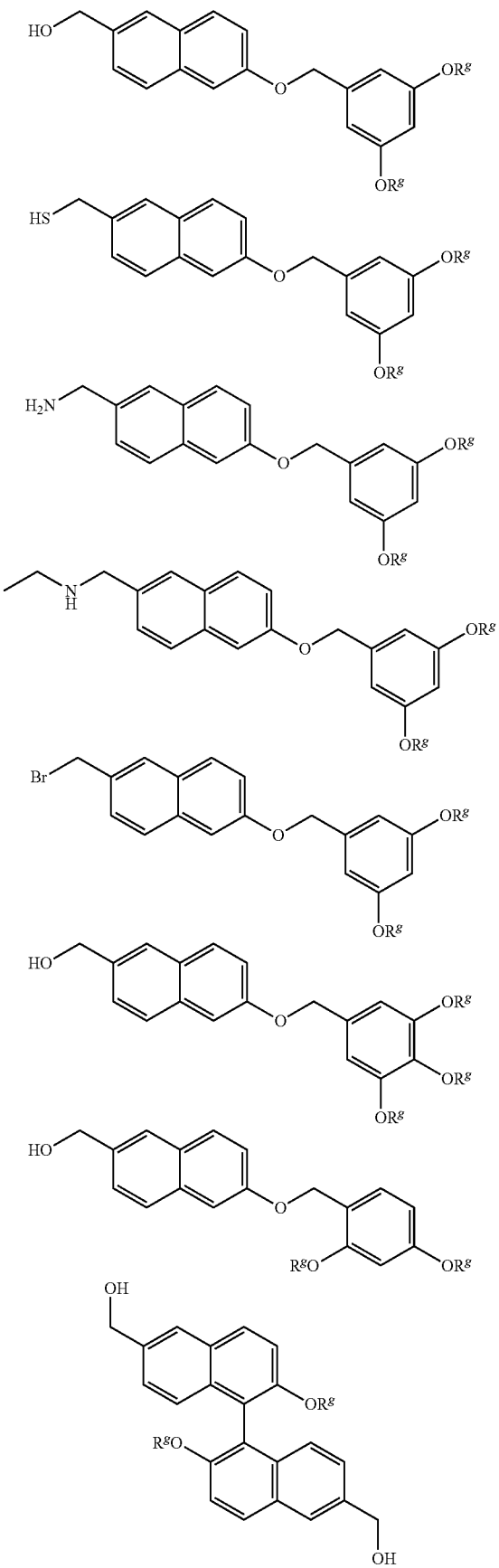

-continued
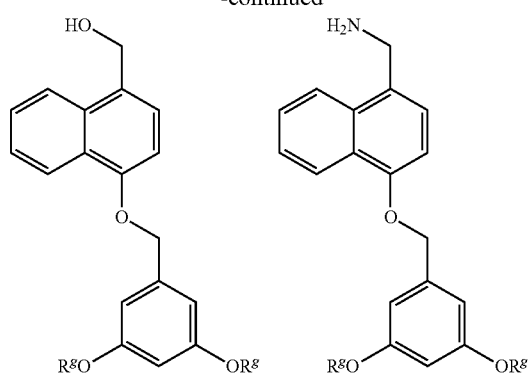
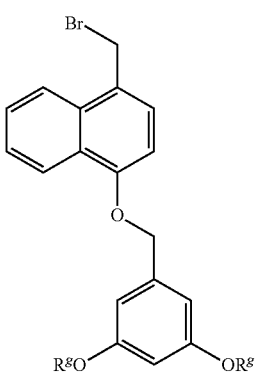
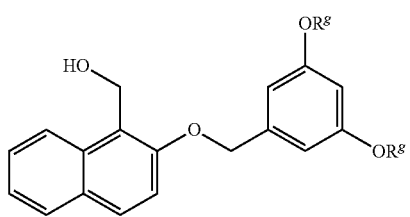
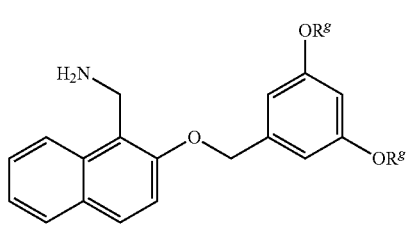
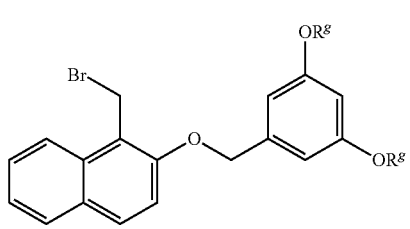
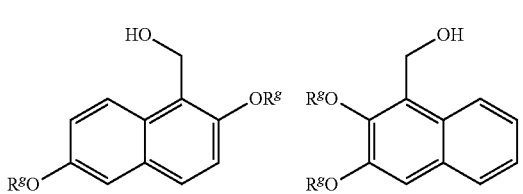
-continued
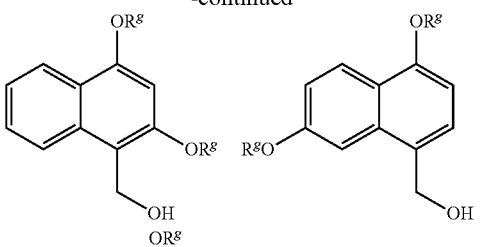
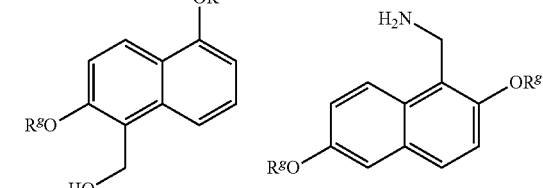
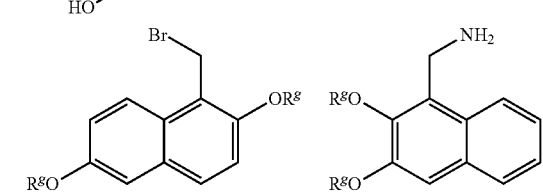
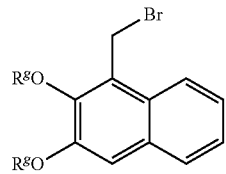
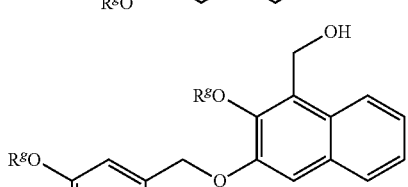
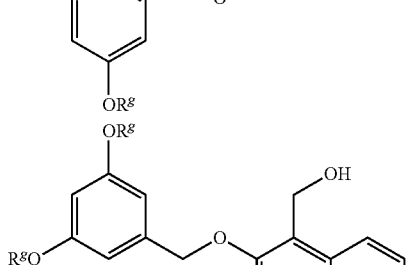
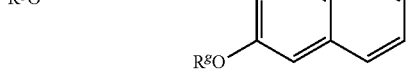
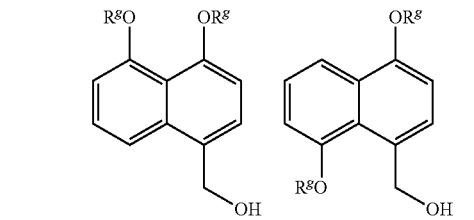
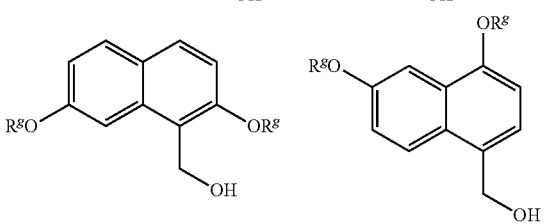

-continued

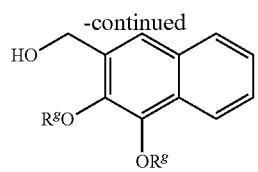

<Method for Producing Condensed Polycyclic Aromatic Hydrocarbon Compound Represented by Formula (1)>

A method for producing the condensed polycyclic aromatic hydrocarbon compound represented by Formula (1) according to the present disclosure is not particularly limited, and can be produced by referring to a known method.

Unless otherwise specified, a raw material compound used for the production may be a commercially available compound, or may be produced by a known method or a method according to the known method.

In addition, the produced condensed polycyclic aromatic hydrocarbon compound represented by Formula (1) may be purified by a known purification method as necessary. For example, a method of isolating and purifying by recrystallization, column chromatography, or the like, a method of purifying by reprecipitation with a unit for changing the solution temperature, a unit for changing the solution composition, or the like, and the like can be performed.

A method for synthesizing the condensed polycyclic aromatic hydrocarbon compound represented by Formula (1) according to the present disclosure can be performed according to the following scheme. In addition, it is also possible to synthesize by referring to the synthesis method described in WO2010/113939A.

embodiment of the present disclosure further includes, in addition to the above-described C-terminal protecting step of protecting a carboxy group or an amide group of an amino acid compound or a peptide compound with the condensed polycyclic aromatic hydrocarbon compound represented by Formula (1), an N-terminal deprotecting step of deprotecting an N-terminal end of an N-terminal and C-terminal protected amino acid compound or an N-terminal and C-terminal protected peptide compound, which is obtained in the C-terminal protecting step, and a peptide chain extending step of condensing the N-terminal end of a C-terminal protected amino acid compound or a C-terminal protected peptide compound, which is obtained in the N-terminal deprotecting step, with an N-terminal protected amino acid compound or an N-terminal protected peptide compound; it is still more preferable that the method for producing a peptide compound according to the embodiment of the present disclosure further includes, in addition to the above steps, a precipitating step of precipitating an N-terminal and C-terminal protected peptide compound obtained in the peptide chain extending step; and it is particularly preferable that the method for producing a peptide compound according to the embodiment of the present disclosure further includes, one or more times in the following order after the precipitating step, a step of deprotecting an N-terminal end of the obtained N-terminal and C-terminal protected peptide compound, a step of condensing the N-terminal end of the obtained C-terminal protected peptide compound with an N-terminal protected amino acid compound or an N-terminal protected peptide compound, and a step of precipitating the obtained N-terminal and C-terminal protected peptide compound.

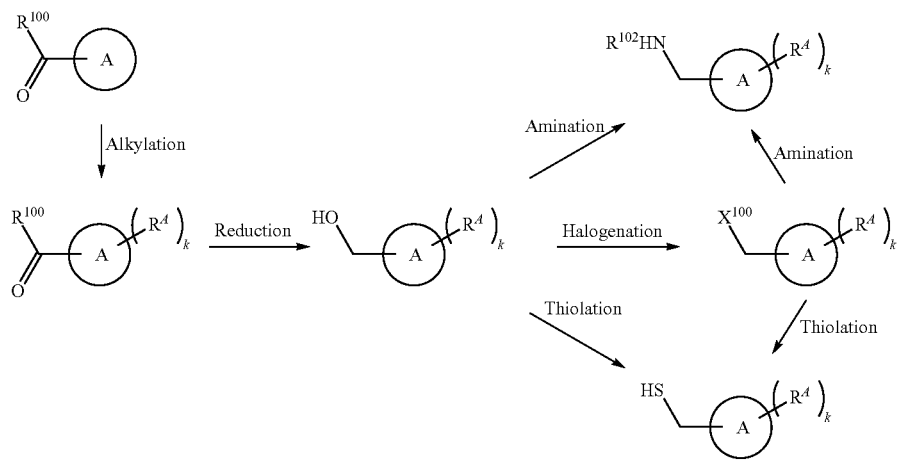

$R^{100}$ represents a hydrogen atom or $OR^{101}$, where $R^{101}$ represents an alkyl group, $X^{100}$ represents Cl, Br, or I, and $R^{102}$ represents a hydrogen atom or an alkyl group.

In the method for producing a peptide compound according to the embodiment of the present disclosure, it is preferable that the step of using the condensed polycyclic aromatic hydrocarbon compound represented by Formula (1) is a C-terminal protecting step of protecting a carboxy group or an amide group of an amino acid compound or a peptide compound with the condensed polycyclic aromatic hydrocarbon compound represented by Formula (1).

In addition, from the viewpoint of ease of synthesizing the peptide compound and yield, it is more preferable that the method for producing a peptide compound according to the In addition, it is preferable that the method for producing a peptide compound according to the embodiment of the present disclosure further includes a C-terminal deprotecting step of deprotecting a C-terminal protective group.

Furthermore, it is preferable that the method for producing a peptide compound according to the embodiment of the present disclosure further includes, before the above-described C-terminal protecting step, a dissolving step of dissolving the condensed polycyclic aromatic hydrocarbon compound represented by Formula (1) in a solvent.

Hereinafter, each step and the like described above will be described in detail.

<Dissolving Step>

It is preferable that the method for producing a peptide compound according to the embodiment of the present disclosure includes, before the above-described C-terminal protecting step, a dissolving step of dissolving the condensed polycyclic aromatic hydrocarbon compound represented by Formula (1) in a solvent.

As the solvent, a general organic solvent can be used for the reaction, but since excellent reactivity can be expected as solubility in the above-described solvent is higher, it is preferable to select a solvent having a high solubility of the condensed polycyclic aromatic hydrocarbon compound represented by Formula (1). Specific examples thereof include halogenated hydrocarbons such as chloroform and dichloromethane; and nonpolar organic solvents such as 1,4-dioxane, tetrahydrofuran, and cyclopentyl methyl ether. Two or more of these solvents may be mixed and used in an appropriate ratio. In addition, as long as the condensed polycyclic aromatic hydrocarbon compound represented by Formula (1) can be dissolved, in the above-described halogenated hydrocarbons or nonpolar organic solvents, aromatic hydrocarbons such as benzene, toluene, and xylene; nitriles such as acetonitrile and propionitrile; ketones such as acetone and 2-butanone; amides such as N,N-dimethylformamide and N-methylpyrrolidone; and sulfoxides such as dimethyl sulfoxide may be mixed and used in an appropriate ratio.

In addition, a solvent described in Organic Process Research & Development, 2017, 21, 3, 365 to 369 may be used.

<C-Terminal Protecting Step>

It is preferable that the method for producing a peptide compound according to the embodiment of the present disclosure includes a C-terminal protecting step of protecting a carboxy group or an amide group of an amino acid compound or a peptide compound with the condensed polycyclic aromatic hydrocarbon compound represented by Formula (1).

The amino acid compound or peptide compound used in the above-described C-terminal protecting step is not particularly limited, and a known compound can be used. However, an N-terminal protected amino acid compound or an N-terminal protected peptide compound is preferable, and an Fmoc-protected amino acid compound or an Fmoc-protected peptide compound is more preferable.

In addition, it is preferable that a hydroxy group, an amino group, a carbonyl group, an amide group, an imidazole group, an indole group, a guanidyl group, a mercapto group, or the like, which is a moiety other than the C-terminal end in the amino acid compound or peptide compound used in the above-described C-terminal protecting step, is protected by a known protective group such as a protective group described later.

The amount of the amino acid compound or peptide compound, which is used as a reaction substrate, to be used is preferably 1 molar equivalent to 10 molar equivalent, more preferably 1 molar equivalent to 5 molar equivalent, still more preferably 1 molar equivalent to 2 molar equivalent, and particularly preferably 1 molar equivalent to 1.5 molar equivalent with respect to 1 molar equivalent of the condensed polycyclic aromatic hydrocarbon compound represented by Formula (1).

In a case where a condensed polycyclic aromatic hydrocarbon compound represented by Formula (1), in which $Y^A$ in Formula (1) is —CH$_2$OH or —CH$_2$SH, is used, it is preferable to add a condensing agent under a catalyst in a solvent which does not affect the reaction, or to react in an acid catalyst.

In a case where a condensed polycyclic aromatic hydrocarbon compound represented by Formula (1), in which $Y^A$ in Formula (1) is —CH$_2$NHR, is used, it is preferable to add a condensing agent in the presence of a condensation additive (condensation accelerator).

The amount of the condensation additive to be used is preferably 0.05 molar equivalent to 1.5 molar equivalent with respect to 1 molar equivalent of the condensed polycyclic aromatic hydrocarbon compound represented by Formula (1).

As the condensing agent, a condensing agent generally used in peptide synthesis can be used without limitation in the present disclosure. Examples thereof include 4-(4,6-dimethoxy-1,3,5-triazin-2-yl)-4-methylmorpholinium chloride (DMTMM), O-(benzotriazol-1-yl)-1,1,3,3-tetramethyluronium hexafluorophosphate (HBTU), O-(7-azabenzotriazol-1-yl)-1,1,3,3-tetramethyluronium hexafluorophosphate (HATU), O-(6-chlorobenzotriazol-1-yl)-1,1,3,3-tetramethyluronium hexafluorophosphate (HBTU(6-Cl)), O-(benzotriazol-1-yl)-1,1,3,3-tetramethyluronium tetrafluoroborate (TBTU), O-(6-chlorobenzotriazol-1-yl)-1,1,3,3-tetramethyluronium tetrafluoroborate (TCTU), (1-cyano-2-ethoxy-2-oxoethylidenaminooxy)dimethylamino-morpholino-carbenium hexafluorophosphate (COMU), dicyclohexylcarbodiimide (DCC), diisopropylcarbodiimide (DIC), 1-ethyl-3-(3-dimethylaminopropyl) carbodiimide (EDC), a hydrochloride salt (EDC/HCl) of 1-ethyl-3-(3-dimethylaminopropyl) carbodiimide, and (benzotriazol-1-yloxy)tripyrrolidinophosphonium hexafluorophosphate (PyBoP), but the condensing agent is not limited thereto.

Among these, DIC, EDC, EDC/HCl, DMTMM, HBTU, HATU, or COMU is preferable.

The amount of the condensing agent to be used is preferably 1 molar equivalent to 10 molar equivalent and more preferably 1 molar equivalent to 5 molar equivalent with respect to 1 molar equivalent of the condensed polycyclic aromatic hydrocarbon compound represented by Formula (1).

As the catalyst used in the condensation reaction, an activating agent generally used in peptide synthesis can be used without limitation.

The amount of the catalyst to be used is preferably more than 0 molar equivalent and 4.0 molar equivalent or less, more preferably 0.05 molar equivalent to 1.5 molar equivalent, and still more preferably 0.1 molar equivalent to 0.3 molar equivalent with respect to 1 molar equivalent of the condensed polycyclic aromatic hydrocarbon compound represented by Formula (1).

As the acid catalyst used in the condensation reaction, an acid catalyst generally used in peptide synthesis can be used without limitation, and examples thereof include methanesulfonic acid, trifluoromethanesulfonic acid, and p-toluenesulfonic acid.

Among these, methanesulfonic acid or p-toluenesulfonic acid is preferable.

The amount of the acid catalyst to be used is preferably more than 0 molar equivalent and 4.0 molar equivalent or less, more preferably 0.05 molar equivalent to 1.5 molar equivalent, and still more preferably 0.1 molar equivalent to 0.3 molar equivalent with respect to 1 molar equivalent of the condensed polycyclic aromatic hydrocarbon compound represented by Formula (1).

In the above-described C-terminal protecting step, it is preferable to add an activating agent in order to promote the reaction and suppress side reactions such as racemization.

The activating agent in the present disclosure is a reagent which, in a case of coexisting with the condensing agent, leads an amino acid to a corresponding active ester, symmetric acid anhydride, or the like to facilitate the formation of a peptide bond (amide bond).

As the activating agent, an activating agent generally used in peptide synthesis can be used without limitation, and examples thereof include 4-dimethylaminopyridine, N-methylimidazole, boronic acid derivative, 1-hydroxybenzotriazole (HOBt), ethyl 1-hydroxytriazole-4-carboxylate (HOCt), 1-hydroxy-7-azabenzotriazole (HOAt), 3-hydroxy-1,2,3-benzotriazin-4(3H)-one (HOOBt), N-hydroxysuccinimide (HOSu), N-hydroxyphthalimide (HOPht), N-hydroxy-5-norbornene-2,3-dicarboxyimide (HONb), pentafluorophenol, and ethyl(hydroxyimino)cyanoacetylate (Oxyma). Among these, 4-dimethylaminopyridine, HOBt, HOCt, HOAt, HOOBt, HOSu, HONb, or Oxyma is preferable.

The amount of the activating agent to be used is preferably more than 0 molar equivalent and 4.0 molar equivalent or less and more preferably 0.1 molar equivalent to 1.5 molar equivalent with respect to the amino acid compound or peptide compound.

As the solvent, the above-described solvent used in the above-described dissolving step can be suitably used.

The reaction temperature is not particularly limited, but is preferably −10° C. to 50° C. and more preferably 0° C. to 40° C. The reaction time is not particularly limited, but is preferably 1 hour to 30 hours.

To confirm the progress of the reaction, a method same as that of a general liquid phase organic synthesis reaction can be applied. That is, the reaction can be traced using thin-layer silica gel chromatography, high performance liquid chromatography, NMR, or the like.

In addition, the N-terminal and C-terminal protected amino acid compound or N-terminal and C-terminal protected peptide compound obtained by the above-described C-terminal protecting step may be purified.

For example, in order to isolate the product obtained after dissolving the obtained N-terminal and C-terminal protected amino acid compound or N-terminal and C-terminal protected peptide compound in a solvent and performing a desired organic synthesis reaction, it is preferable to perform a method of changing the solvent to a solvent in which the N-terminal and C-terminal protected amino acid compound or N-terminal and C-terminal protected peptide compound is dissolved (for example, change of solvent composition or change of solvent type) and reprecipitating the resultant.

Specifically, for example, the reaction is performed under conditions such that the N-terminal and C-terminal protected amino acid compound or N-terminal and C-terminal protected peptide compound is dissolved, and after the reaction, the solvent is distilled off and then replaced, or after the reaction, by adding a polar solvent to the reaction system without distilling off the solvent, aggregates are precipitated and impurities are eliminated. As the solvent for replacement, polar organic solvents such as methanol, acetonitrile, and water are used alone or in combination. That is, the reaction is performed under conditions such that the N-terminal and C-terminal protected amino acid compound or N-terminal and C-terminal protected peptide compound is dissolved, and in the solvent replacement after the reaction, for example, a halogenated solvent, THF, or the like is used for dissolution, and a polar organic solvent such as methanol, acetonitrile, and water is used for precipitation.

<N-Terminal Deprotecting Step>

It is preferable that the method for producing a peptide compound according to the embodiment of the present disclosure includes an N-terminal deprotecting step of deprotecting an N-terminal end of the N-terminal and C-terminal protected amino acid compound or N-terminal and C-terminal protected peptide compound, which is obtained in the C-terminal protecting step.

As the N-terminal protective group, a protective group for an amino group described later, which is generally used in technical fields such as peptide chemistry, can be used, but in the present disclosure, a tert-butoxycarbonyl group (hereinafter, also referred to as a Boc group), a benzyloxycarbonyl group (hereinafter, also referred to as a Cbz group or a Z group), or a 9-fluorenylmethoxycarbonyl group (hereinafter, also referred to as an Fmoc group) is suitably used.

The deprotection condition is appropriately selected depending on the type of the temporary protective group, but a group which can be deprotected under conditions different from the removal of the protective group derived from the condensed polycyclic aromatic hydrocarbon compound represented by Formula (1) is preferable. For example, in a case of the Fmoc group, the deprotection is performed by treating with a base, and in a case of the Boc group, the deprotection is performed by treating with an acid. The reaction is performed in a solvent which does not affect the reaction.

Examples of the base include secondary amines such as dimethylamine and diethylamine, and non-nucleophilic organic bases such as 1,8-diazabicyclo[5.4.0]-7-undecene (DBU), 1,4-diazabicyclo[2.2.2]octane (DABCO), and 1,5-diazabicyclo[4.3.0]-5-nonene (DBN).

As the solvent, the above-described solvent used in the above-described dissolving step can be suitably used.

<Peptide Chain Extending Step>

It is preferable that the method for producing a peptide compound according to the embodiment of the present disclosure includes a peptide chain extending step of condensing the N-terminal end of a C-terminal protected amino acid compound or a C-terminal protected peptide compound, which is obtained in the N-terminal deprotecting step, with an N-terminal protected amino acid compound or an N-terminal protected peptide compound.

The above-described peptide chain extending step is preferably performed under peptide synthesis conditions generally used in the field of peptide chemistry, in which the above-described condensing agent, condensation additive, and the like are used.

The N-terminal protected amino acid compound or N-terminal protected peptide compound is not particularly limited, and a desired compound can be used. However, an Fmoc-protected amino acid compound or an Fmoc-protected peptide compound can be suitably used.

In addition, it is preferable that a hydroxy group, an amino group, a carbonyl group, an amide group, an imidazole group, an indole group, a guanidyl group, a mercapto group, or the like, which is a moiety other than the C-terminal end in the N-terminal protected amino acid compound or N-terminal protected peptide compound, is protected by a known protective group such as a protective group described later.

<Precipitating Step>

It is preferable that the method for producing a peptide compound according to the embodiment of the present disclosure further includes a precipitating step of precipitating the N-terminal and C-terminal protected peptide compound obtained in the peptide chain extending step.

The above-described precipitating step can be performed in the same manner as the precipitation method in the purification which may be performed after the above-described C-terminal protecting step.

<Chain Extension>

It is preferable that the method for producing a peptide compound according to the embodiment of the present disclosure further includes, one or more times in the following order after the precipitating step, a step of deprotecting an N-terminal end of the obtained N-terminal and C-terminal protected peptide compound, a step of condensing the N-terminal end of the obtained C-terminal protected peptide compound with an N-terminal protected amino acid compound or an N-terminal protected peptide compound, and a step of precipitating the obtained N-terminal and C-terminal protected peptide compound.

By repeating the above-described three steps, the chain extension of the obtained peptide compound can be easily performed.

Each step in the above-described three steps can be performed in the same manner as each corresponding step described above.

<C-Terminal Deprotecting Step>

It is preferable that the method for producing a peptide compound according to the embodiment of the present disclosure further includes a C-terminal deprotecting step of deprotecting a C-terminal protective group.

In the above-described C-terminal deprotecting step, by removing the C-terminal protective group formed by the condensed polycyclic aromatic hydrocarbon compound represented by Formula (1) in the C-terminal protected peptide compound having a desired number of amino acid residues, a peptide compound, which is the final target product, can be obtained.

Preferred examples of a method of removing the C-terminal protective group include a deprotecting method using an acidic compound.

Examples thereof include a method using an acid catalyst and a hydrogenating method using a metal catalyst. Examples of the acid catalyst include trifluoroacetic acid (TFA) and hydrochloric acid, and TFA is preferable. The concentration of TFA can be appropriately selected depending on the protective group and the deprotection condition, and is preferably 0.01% by mass to 100% by mass and more preferably 1% by mass to 100% by mass with respect to the total mass of the solvent used.

In addition, the concentration of TFA is preferably 70% by mass or less, more preferably 50% by mass or less, still more preferably 30% by mass or less, even more preferably 10% by mass or less, and particularly preferably 1% by mass or less. In the present disclosure, the C-terminal protective group can be deprotected even under weak acid conditions, and a side reaction of the obtained peptide can be suppressed.

The deprotection time is preferably 5 hours or less, more preferably 3 hours or less, and still more preferably 1 hour or less.

The peptide compound, which is the final target product obtained by the method for producing a peptide compound according to the embodiment of the present disclosure, can be isolated and purified according to a method commonly used in peptide chemistry. For example, the peptide compound, which is the final target product, can be isolated and purified by extraction and washing the reaction mixture, crystallization, chromatography, and the like.

The type of peptide produced by the method for producing a peptide compound according to the embodiment of the present disclosure is not particularly limited, but it is preferable that the number of amino acid residues of the peptide compound is, for example, approximately several tens or less. Same as existing or unknown synthetic or native peptides, the peptide obtained by the method for producing a peptide compound according to the embodiment of the present disclosure can be used in various fields such as pharmaceuticals, foods, cosmetics, electronic materials, biosensors, and the like, but the use of the peptide is not limited thereto.

In the method for producing a peptide compound according to the embodiment of the present disclosure, the precipitating step can be appropriately omitted as long as it does not affect the reaction in the next step.

In a case where the amino acid compound or peptide compound used in the method for producing a peptide compound according to the embodiment of the present disclosure has a hydroxy group, an amino group, a carboxy group, a carbonyl group, a guadinyl group, a mercapto group, or the like, a protective group generally used in peptide chemistry or the like may be introduced into these groups, and the target compound can be obtained by removing the protective group as necessary after the reaction.

Examples of a protective group of the hydroxy group include an alkyl group having 1 to 6 carbon atoms (for example, methyl, ethyl, propyl, isopropyl, butyl, and tert-butyl), a phenyl group, a trityl group, an aralkyl group having 7 to 10 carbon atoms (for example, benzyl), a formyl group, an acyl group having 1 to 6 carbon atoms (for example, acetyl and propionyl), a benzoyl group, an aralkyl-carbonyl group having 7 to 10 carbon atoms (for example, benzylcarbonyl), a 2-tetrahydropyranyl group, a 2-tetrahydrofuranyl group, a silyl group (for example, trimethylsilyl, triethylsilyl, dimethylphenylsilyl, tert-butyldimethylsilyl, and tert-butyldiethylsilyl), and an alkenyl group having 2 to 6 carbon atoms (for example, 1-propenyl).

These groups may be substituted with one to three substituents selected from the group consisting of a halogen atom (for example, fluorine atom, chlorine atom, bromine atom, and iodine atom), an alkyl group having 1 to 6 carbon atoms (for example, methyl, ethyl, and propyl), an alkoxy group having 1 to 6 carbon atoms (for example, methoxy, ethoxy, and propoxy), and a nitro group.

Examples of a protective group of the amino group include a formyl group, an acyl group having 1 to 6 carbon atoms (for example, acetyl and propionyl), an alkoxycarbonyl group having 1 to 6 carbon atoms (for example, methoxycarbonyl, ethoxycarbonyl, and Boc group), a benzoyl group, an aralkyl-carbonyl group having 7 to 10 carbon atoms (for example, benzylcarbonyl), an aralkyloxycarbonyl group having 7 to 14 carbon atoms (for example, benzyloxycarbonyl and Fmoc group), a trityl group, a monomethoxytrityl group, a 1-(4,4-Dimethyl-2,6-dioxocyclohex-1-ylidene)-3-methylbutyl group, a phtaloyl group, an N,N-dimethylaminomethylene group, a silyl group (for example, trimethylsilyl, triethylsilyl, dimethylphenylsilyl, tert-butyldimethylsilyl, and tert-butyldiethylsilyl), and an alkenyl group having 2 to 6 carbon atoms (for example, 1-propenyl). These groups may be substituted with one to three substituents selected from the group consisting of a halogen atom (for example, fluorine atom, chlorine atom, bromine atom, and iodine atom), an alkoxy group having 1 to 6 carbon atoms (for example, methoxy, ethoxy, and propoxy), and a nitro group.

Examples of a protective group of the carboxy group include an alkyl group having 1 to 6 carbon atoms (for example, methyl, ethyl, propyl, isopropyl, butyl, and tert-butyl), an aralkyl group having 7 to 10 carbon atoms (for example, benzyl), a phenyl group, a trityl group, a silyl group (for example, trimethylsilyl, triethylsilyl, dimethylphenylsilyl, tert-butyl dim ethyl silyl, tert-butyl di ethyl silyl, and tert-butyldiphenylsilyl), and an alkenyl group having 2 to 6 carbon atoms (for example, 1-allyl). These groups may be substituted with one to three substituents selected from the group consisting of a halogen atom (for example, fluorine atom, chlorine atom, bromine atom, and iodine atom), an alkoxy group having 1 to 6 carbon atoms (for example, methoxy, ethoxy, and propoxy), and a nitro group.

Examples of a protective group of the carbonyl group include cyclic acetals (for example, 1,3-dioxane) and acyclic acetals (for example, di(alkyl having 1 to 6 carbon atoms) acetal).

Examples of a protective group of the guanidyl group include a 2,2,4,6,7-pentamethyldihydrobenzofuran-5-sulfonyl group, a 2,3,4,5,6-pentamethylbenzenesulfonyl group, a tosyl group, and a nitro group.

Examples of a protective group of the mercapto group (sulfhydryl group) include a trityl group, a 4-methylbenzyl group, an acetylaminomethyl group, a t-butyl group, and a t-butylthio group.

In addition, the method of removing these protective groups may be performed according to a known method described in, for example, Protective Groups in Organic Synthesis, John Wiley and Sons (1980). For example, a method using acid, base, ultraviolet light, hydrazine, phenylhydrazine, sodium N-methyldithiocarbamate, tetrabutylammonium fluoride, palladium acetate, trialkylsilyl halide (for example, trimethylsilyl iodide and trimethylsilyl bromide), or the like, a reduction method, and the like are used.

(Protective Group-Forming Reagent)

The protective group-forming reagent according to the embodiment of the present disclosure includes a condensed polycyclic aromatic hydrocarbon compound represented by Formula (1).

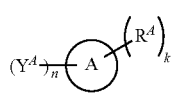

(1)

In Formula (1), a ring A represents a condensed polycyclic aromatic hydrocarbon ring, $Y^A$'s each independently represent —CH$_2$OH, —CH$_2$NHR, —CH$_2$SH, or —CH$_2$X$^0$, where R represents a hydrogen atom, an alkyl group, or an aralkyl group, and X$^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 12 or more, and the ring A may further have a substituent in addition to $Y^A$ and $R^A$.

The protective group-forming reagent according to the embodiment of the present disclosure is preferably a protective group-forming reagent of a carboxy group or an amide group, and more preferably a C-terminal protective group-forming reagent of an amino acid compound or a peptide compound.

A preferred aspect of the condensed polycyclic aromatic hydrocarbon compound represented by Formula (1) in the protective group-forming reagent according to the embodiment of the present disclosure is the same as the above-described preferred aspect of the condensed polycyclic aromatic hydrocarbon compound represented by Formula (1) according to the present disclosure.

The protective group-forming reagent according to the embodiment of the present disclosure may be a solid reagent or a liquid reagent.

The content of the condensed polycyclic aromatic hydrocarbon compound represented by Formula (1) in the protective group-forming reagent according to the embodiment of the present disclosure is not particularly limited, but is preferably 0.1% by mass to 100% by mass, more preferably 1% by mass to 100% by mass, and still more preferably 3% by mass to 100% by mass with respect to the total mass of the protective group-forming reagent.

The protective group-forming reagent according to the embodiment of the present disclosure may include a component other than the condensed polycyclic aromatic hydrocarbon compound represented by Formula (1).

As the other components, a known component can be included. Examples thereof include water, an organic solvent, an antioxidant, and a pH adjuster.

(Condensed Polycyclic Aromatic Hydrocarbon Compound Represented by Formula (1a))

The compound according to the embodiment of the present disclosure is a condensed polycyclic aromatic hydrocarbon compound represented by Formula (1a).

(1a)

In Formula (1a), a ring A represents a condensed polycyclic aromatic hydrocarbon ring, $Y^A$'s each independently represent —CH$_2$OH, —CH$_2$NHR, —CH$_2$SH, or —CH$_2$X$^0$, where R represents a hydrogen atom, an alkyl group, or an aralkyl group, and X$^0$ represents Cl, Br, or I, k represents an integer of 1 to 5, n represents 1 or 2, $R^A$'s each independently represent an aliphatic hydrocarbon group or an organic group having an aliphatic hydrocarbon group, the number of carbon atoms in at least one aliphatic hydrocarbon group included in at least one $R^A$ is 18 or more, and the ring A may further have a substituent in addition to $Y^A$ and $R^A$.

The condensed polycyclic aromatic hydrocarbon compound represented by Formula (1a), which is the compound according to the embodiment of the present disclosure, is a novel compound and can be suitably used for producing a peptide compound. Among these, the compound according to the embodiment of the present disclosure can be suitably used as a protective group-forming reagent, more suitably used as a protective group-forming reagent of a carboxy group or an amide group, and particularly suitably used as a C-terminal protective group-forming reagent of an amino acid compound or a peptide compound.

The condensed polycyclic aromatic hydrocarbon compound represented by Formula (1a) in the compound according to the embodiment of the present disclosure is the same as the condensed polycyclic aromatic hydrocarbon compound represented by Formula (1) in the above-described method for producing a peptide compound according to the embodiment of the present disclosure, except that the number of carbon atoms in at least one aliphatic hydrocarbon group included in at least one $R^A$ is 18 or more. In addition, the same applies to preferred aspects other than the preferred aspect described later.

The condensed polycyclic aromatic hydrocarbon compound represented by Formula (1a) is a compound which has at least one aliphatic hydrocarbon group having 18 or more carbon atoms in at least one $R^A$. From the viewpoint of solubility in a solvent, crystallization property, and yield, a compound which has at least one aliphatic hydrocarbon group having 18 to 100 carbon atoms in at least one $R^A$ is preferable, a compound which has at least one aliphatic hydrocarbon group having 18 to 40 carbon atoms in at least one $R^A$ is more preferable, and a compound which has at least one aliphatic hydrocarbon group having 20 to 36 carbon atoms in at least one $R^A$ is still more preferable.

From the viewpoint of deprotection rate, crystallization property, solubility in a solvent, and yield, the condensed polycyclic aromatic hydrocarbon compound represented by Formula (1a) is preferably a compound represented by any of Formula (10a), Formula (20a), or Formula (30a), more preferably a compound represented by Formula (10a) or Formula (20a), and particularly preferably a compound represented by Formula (10a).

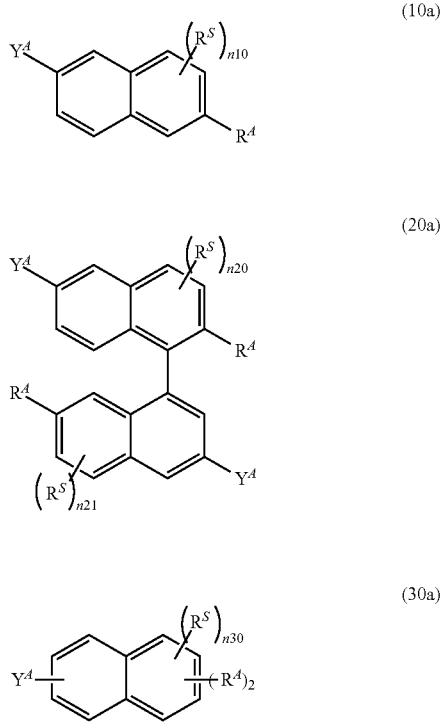

In Formula (10a), Formula (20a), and Formula (30a), $Y^A$'s each independently represent —$CH_2OH$, —$CH_2NHR$, —$CH_2SH$, or —$CH_2X^0$, where R represents a hydrogen atom, an alkyl group, or an aralkyl group, and $X^0$ represents Cl, Br, or I, $R^A$'s each independently represent an aliphatic hydrocarbon group or an organic group having an aliphatic hydrocarbon group, the number of carbon atoms in at least one aliphatic hydrocarbon group included in at least one $R^A$ is 18 or more, $R^S$'s each independently represent a substituent, n10 represents an integer of 0 to 6, and n20, n21, and n30 each independently represent an integer of 0 to 5.

The compound represented by any of Formula (10a), Formula (20a), or Formula (30a) is the same as the compound represented by any of Formula (10), Formula (20), or Formula (30) in the above-described method for producing a peptide compound according to the embodiment of the present disclosure, except that the number of carbon atoms in at least one aliphatic hydrocarbon group included in at least one $R^A$ is 18 or more. In addition, the same applies to preferred aspects other than the preferred aspect described later.

$R^A$ in the compound represented by any of Formula (10a), Formula (20a), or Formula (30a) has the same meaning as $R^A$ in the condensed polycyclic aromatic hydrocarbon compound represented by Formula (1a), and the preferred aspects thereof are also the same.

In addition, the condensed polycyclic aromatic hydrocarbon compound represented by Formula (1a) can be synthesized in the same manner as in the condensed polycyclic aromatic hydrocarbon compound represented by Formula (1).

EXAMPLES

Hereinafter, the embodiments of the present invention will be more specifically described with reference to Examples. The materials, amounts to be used, proportions, treatment contents, treatment procedures, and the like shown in Examples can be appropriately modified as long as the modifications do not depart from the spirit of the embodiments of the present invention. Therefore, the scope of the embodiments of the present invention is not limited to the following specific examples. In addition, "parts" and "%" are on a mass basis unless otherwise specified.

Unless otherwise specified, purification by column chromatography was performed using an automatic purification device ISOLERA (manufactured by Biotage Ltd.) or a medium pressure liquid chromatograph YFLC-Wprep 2XY.N (manufactured by YAMAZEN).

Unless otherwise specified, SNAPKP-SI1 Cartridge (manufactured by Biotage Ltd.) or a high flash column W001, W002, W003, W004, or W005 (manufactured by YAMAZEN) was used as a carrier in silica gel column chromatography.

The mixing ratio in an eluent used for column chromatography is the volume ratio. For example, "gradient elution of hexane:ethyl acetate=50:50 to 0:100" means that an eluent of 50% hexane and 50% ethyl acetate is finally changed to an eluent of 0% hexane and 100% ethyl acetate.

In addition, "gradient elution of hexane:ethyl acetate=50:50 to 0:100 and gradient elution of methanol:ethyl acetate=0:100 to 20:80" means that an eluent of 50% hexane and 50% ethyl acetate is changed to an eluent of 0% hexane and 100% ethyl acetate, the eluent of 0% hexane and 100% ethyl acetate is switched to an eluent of 0% methanol and 100% ethyl acetate, and then the eluent of 0% methanol and 100% ethyl acetate is finally changed to an eluent of 20% methanol and 80% ethyl acetate.

MS spectrum was measured using ACQUITY SQD LC/MS System (manufactured by Waters Corporation; ionization method; electrospray ionization (ESI) method).

NMR spectrum was measured using Bruker AV300 (manufactured by Bruker, 300 MHz) or Bruker AV400 (manufactured by Bruker, 400 MHz), using tetramethylsilane as an internal reference, and all δ values were shown in ppm.

<Synthesis of Protective Group-Forming Reagent (Compound (1-1))>

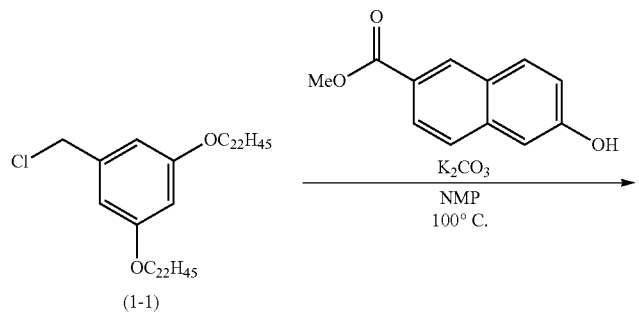

(1-1)

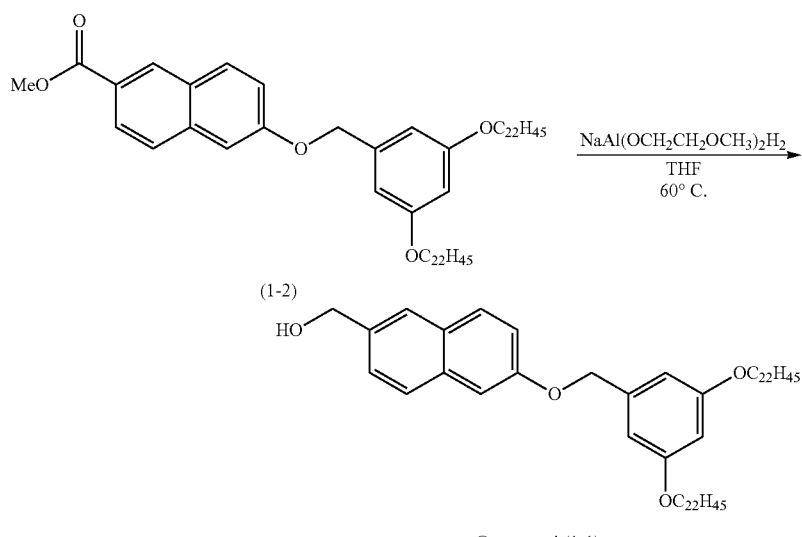

Compound (1-1)

An intermediate (1-1) was synthesized according to the method described in EP2518041A.

The intermediate (1-1) (12.00 g, 15.5 mmol), methyl 6-hydroxy-2-naphthoate (6.26 g, 30.9 mmol), potassium carbonate (8.55 g, 61.9 mmol), and N-methylpyrrolidone (NMP, 155 mL) were mixed, and the mixture was stirred at 100° C. for 4 hours under a nitrogen atmosphere. The reaction solution was cooled to room temperature and extracted with cyclopentyl methyl ether and water. Methanol was added to the obtained organic layer to precipitate solid, and the solid was filtered and dried under reduced pressure to obtain an intermediate (1-2) (13.8 g, yield: 95%).

The intermediate (1-2) (4.00 g, 4.25 mmol) and tetrahydrofuran (66 mL) were mixed under a nitrogen atmosphere, the mixture was stirred at 30° C., and then a sodium bis(2-methoxyethoxy)aluminum hydride toluene solution (3.6 M (=3.6 mol/L)) (3.5 mL, 12.8 mmol) was added dropwise thereto. The reaction solution was stirred at 30° C. for 2 hours, a saturated aqueous solution (50 mL) of potassium sodium tartrate was gently added dropwise thereto, the mixture was separated, methanol was added to the obtained organic layer to precipitate solid, and the solid was filtered and dried to obtain a compound (1-1) (3.87 g, yield: 99%).

$^1$H-NMR (CDCl$_3$, 400 MHz): δ=0.88 (6H, t), 1.19 to 1.82 (80H, m), 3.94 (4H, t), 4.82 (2H, d), 5.10 (2H, s), 6.42 (1H, t), 6.61 (2H, d), 7.20 (1H, t), 7.24 (1H, dd), 7.45 (1H, dd), 7.69 to 7.78 (3H, m)

<Synthesis of Protective Group-Forming Reagent (Compound (1-2))>

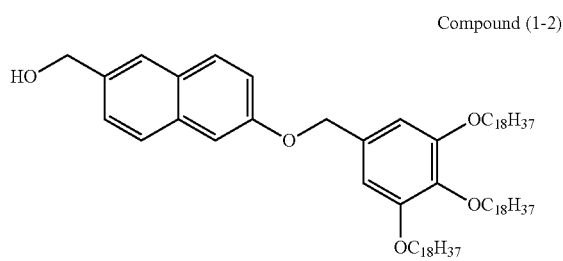

Compound (1-2)

A compound (1-2) was obtained by synthesizing in the same manner as in the compound (1-1).

$^1$H-NMR (CDCl$_3$, 300 MHz): δ=0.88 (9H, t), 1.19 to 1.85 (96H, m), 3.93 to 4.01 (6H, m), 4.83 (2H, d), 5.06 (2H, s), 6.42 (1H, t), 6.67 (2H, d), 7.22 to 7.26 (2H, m), 7.46 (1H, dd), 7.72 to 7.77 (3H, m)

<Synthesis of Protective Group-Forming Reagent (Compound (1-3))>

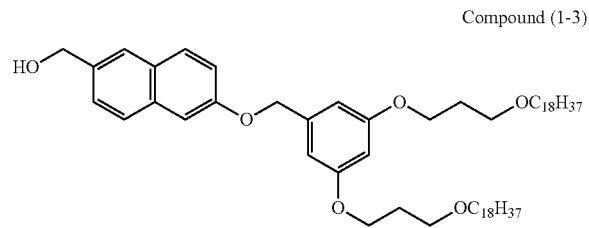

Compound (1-3)

A compound (1-3) was obtained by synthesizing in the same manner as in the compound (1-1).

$^1$H-NMR (CDCl$_3$, 400 MHz): δ=0.88 (6H, t), 1.24 to 1.58 (64H, m), 2.04 (4H, m), 3.41 (4H, t), 3.58 (4H, t), 4.05 (4H, t), 4.83 (2H, d), 5.10 (2H, s), 6.44 (1H, t), 6.63 (2H, d), 7.20 to 7.26 (2H, m), 7.45 (1H, dd), 7.72 to 7.76 (3H, m)

<Synthesis of Protective Group-Forming Reagent (Compound (1-4))>

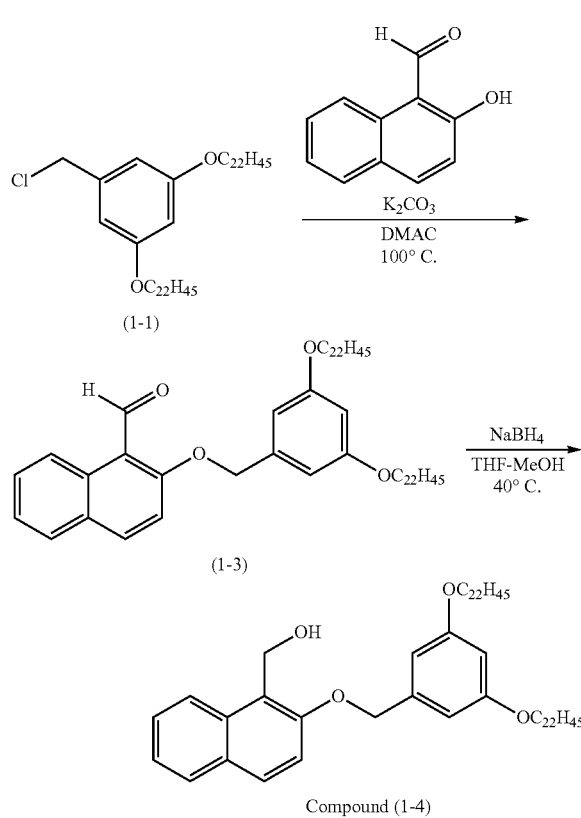

Compound (1-4)

The intermediate (1-1) (3.00 g, 3.87 mmol), 2-hydroxy-1-naphthaldehyde (1.00 g, 3.87 mmol), potassium carbonate (1.07 g, 7.73 mmol), and N,N-dimethylacetamide (DMAc, 30 mL) were mixed, and the mixture was stirred at 100° C. for 3 hours under a nitrogen atmosphere. The reaction solution was cooled to room temperature, methanol was added thereto to precipitate solid, and the solid was filtered and dried under reduced pressure to obtain an intermediate (1-3) (4.46 g).

The intermediate (1-3) (3.52 g, 3.86 mmol), tetrahydrofuran (154 mL), and methanol (7.7 mL) were mixed under a nitrogen atmosphere, the mixture was stirred at room temperature, and then sodium borohydride (0.292 g, 7.72 mmol) was added thereto. The reaction solution was stirred at 40° C. for 30 minutes, and after confirming the disappearance of raw materials, silica gel (50 g) was added little by little to the reaction solution to stop the reaction. After filtering the silica gel and concentrating the filtrate under reduced pressure, the obtained residue was dissolved in THF (15 mL), methanol (100 mL) was added thereto to precipitate solid, and the solid was filtered and dried under reduced pressure to obtain a compound (1-4) (3.44 g, yield: 98%).

$^1$H-NMR (CDCl$_3$, 400 MHz): δ=0.88 (6H, t), 1.19 to 1.80 (80H, m), 3.92 (4H, t), 5.17 (2H, s), 5.22 (2H, d), 6.40 (1H, s), 6.58 (2H, d), 7.29 (1H, t), 7.37 (1H, t), 7.53 (1H, t), 7.80 (2H, dd), 8.14 (1H, d)

<Synthesis of Protective Group-Forming Reagent (Compound (1-5))>

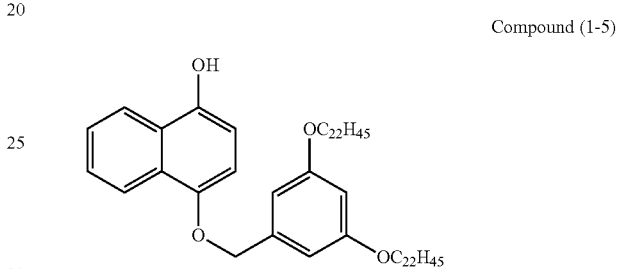

Compound (1-5)

A compound (1-5) was obtained by synthesizing in the same manner as in the compound (1-4).

$^1$H-NMR (CDCl$_3$, 400 MHz): δ=0.88 (6H, t), 1.19 to 1.85 (80H, m), 3.95 (4H, t), 5.06 (2H, d), 5.18 (2H, s), 6.42 (1H, t), 6.63 (2H, d), 6.82 (1H, d), 7.38 (1H, d), 7.48 to 7.65 (2H, m), 8.12 (1H, d), 8.41 (1H, d)

<Synthesis of Protective Group-Forming Reagent (Compound (2-1))>

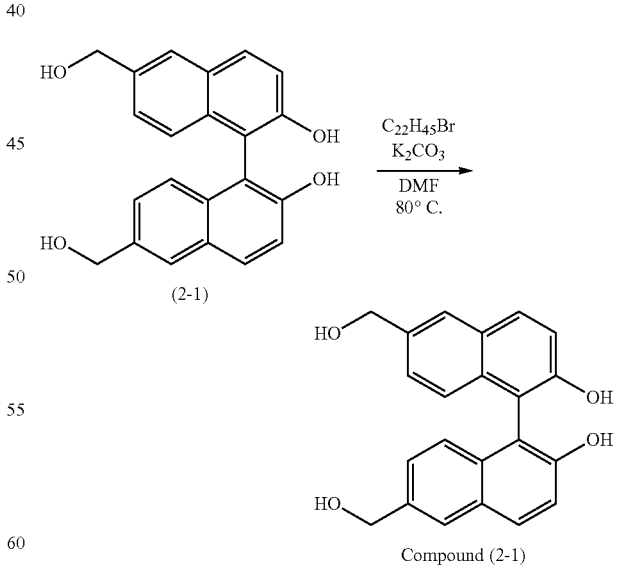

Compound (2-1)

An intermediate (2-1) was synthesized according to the method described in J. Am. Chem. Soc., 2010, 132, 14625 to 14637.

The intermediate (2-1) (346 mg, 1.00 mmol), 1-bromodocosane (1166 mg, 3.00 mmol), potassium carbonate (897 mg, 6.5 mmol), and N,N-dimethylformamide (DMF, 10 mL) were mixed, and the mixture was stirred at 80° C. for 2 hours under a nitrogen atmosphere. The reaction solution was cooled to room temperature and extracted with dichloromethane and water, and the organic phase was concentrated under reduced pressure. The obtained crude product was purified by subjecting the obtained crude product to silica gel chromatography (eluent: hexane/ethyl acetate=1/9 to 3/7 (volume ratio)), further recrystallized with acetonitrile, filtered, and dried to obtain a compound (2-1) (200 mg, yield: 21%).

$^1$H-NMR (CDCl$_3$, 400 MHz): δ=0.83 to 1.63 (86H, m), 3.86 to 3.92 (4H, m), 4.79 (4H, d), 7.12 (2H, d), 7.20 (2H, dd), 7.40 (2H, d), 7.82 (2H, d), 7.91 (2H, d)

<Synthesis of Protective Group-Forming Reagent (Compound (2-2))>

Compound (2-2)

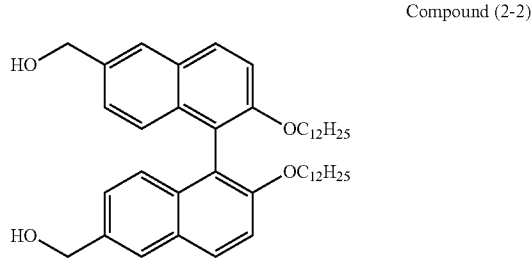

A compound (2-2) was obtained by synthesizing in the same manner as in the compound (2-1), except that the length of the alkyl group in the bromide used was changed.

<Synthesis of Comparative Protective Group-Forming Reagent (Comparative Compound (2-1))>

Compound (2-1)

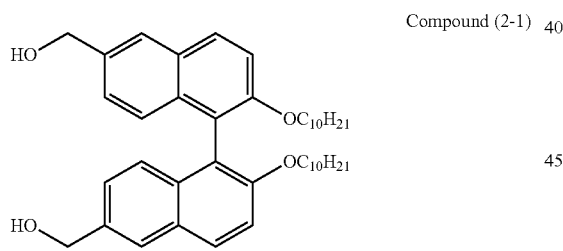

A comparative compound (2-1) was obtained by synthesizing in the same manner as in the compound (2-1), except that the length of the alkyl group in the bromide used was changed.

<Synthesis of Protective Group-Forming Reagent (Compound (3-1))>

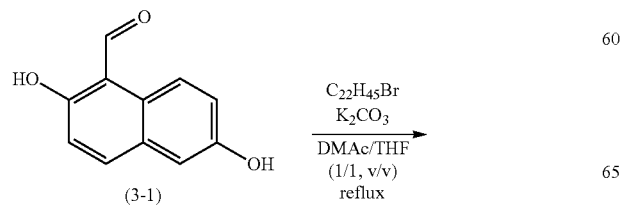

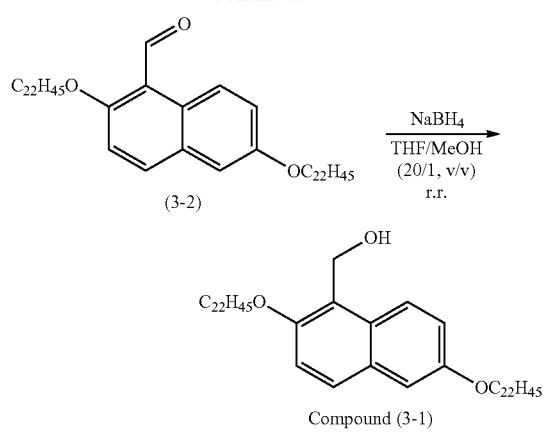

Compound (3-1)

An intermediate (3-1) was synthesized according to the method described in Journal of Organic Chemistry, 2009, 74, 2, 520 to 529.

The intermediate (3-1) (132 mg, 0.7 mmol), 1-bromodocosane (601 mg, 1.54 mmol), potassium carbonate (388 mg, 2.8 mmol), N,N-dimethylacetamide (DMAc, 3.5 mL), and tetrahydrofuran (3.5 mL) were mixed, and the mixture was stirred at 90° C. for 5 hours under a nitrogen atmosphere. The reaction solution was cooled to room temperature, methanol was added thereto to precipitate solid, and the solid was collected by filtration, washed with water and methanol, and dried under reduced pressure to obtain an intermediate (3-2) (480 mg, 85%).

The intermediate (3-2) (480 mg, 0.6 mmol), tetrahydrofuran (90 mL), and methanol (4.5 mL) were mixed under a nitrogen atmosphere, and sodium borohydride (68 mg, 1.8 mmol) was added thereto. The reaction solution was heated to 40° C. and stirred for 2 hours, and then silica gel was added thereto to quench the reaction. The reaction solution was filtered, the organic phase was concentrated under reduced pressure, and the obtained crude product was purified by subjecting the obtained crude product to silica gel chromatography (eluent: hexane/dichloromethane=7/3 to 1/1 (volume ratio)) to obtain a compound (3-1) (427 mg, yield: 89%).

$^1$H-NMR (CDCl$_3$, 400 MHz): δ=0.88 (6H, t), 1.25 to 1.53 (76H, m), 1.80 to 1.87 (4H, m), 4.05 (2H, t), 4.11 (2H, t), 5.16 (2H, d), 7.10 (1H, d), 7.19 to 7.25 (2H, m), 7.68 (1H, d), 8.01 (1H, d)

Example 1

<Synthesis of Protected Amino Acid Compound (N-Terminal and C-Terminal Protected Amino Acid (1))>

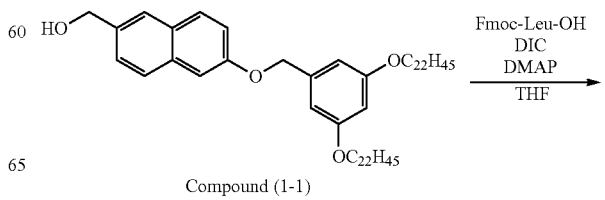

Compound (1-1)

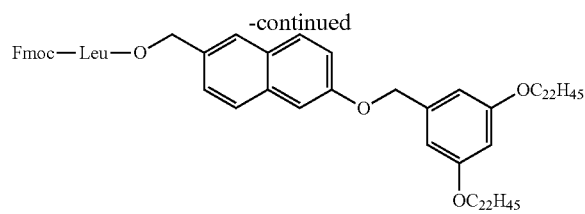

N-protected and C-protected amino acid (1-1)

The compound (1-1) (914 mg, 1.00 mmol), N-[(9H-fluoren-9-ylmethoxy)carbonyl]-L-leucine (530 mg, 1.50 mmol), and tetrahydrofuran (10 mL) were mixed at room temperature, and 4-dimethylaminopyridine (24.4 mg, 0.20 mmol) and diisopropylcarbodiimide (232 µL, 1.50 mmol) were added thereto. After stirring the reaction solution under nitrogen for 1 hour, methanol (50 mL) was added thereto to precipitate solid, and the solid was filtered and dried under reduced pressure to obtain an N-protected and C-protected amino acid (1) (1250 mg, 100%).

Fmoc represents a 9-fluorenylmethoxycarbonyl group, and Leu represents a leucine residue.

Examples 2 to 8 and Comparative Example 1

Same as the method for obtaining the N-protected and C-protected amino acid (1), the corresponding N-protected and C-protected amino acid was synthesized by condensing the compound (1-2), compound (1-3), compound (1-4), compound (1-5), compound (2-1), compound (2-2), compound (3-1), or comparative compound (2-1) with N-[(9H-fluoren-9-ylmethoxy)carbonyl]-L-leucine. The yields obtained are shown in Table 1.

TABLE 1

|  | Compound | Yield (%) |
| --- | --- | --- |
| Example 1 | Compound (1-1) | 100 |
| Example 2 | Compound (1-2) | 98 |
| Example 3 | Compound (1-3) | 94 |
| Example 4 | Compound (1-4) | 94 |
| Example 5 | Compound (1-5) | 95 |
| Example 6 | Compound (2-1) | 98 |
| Example 7 | Compound (2-2) | 86 |
| Example 8 | Compound (3-1) | 98 |
| Comparative example 1 | Comparative compound (2-1) | 79 |

As shown in Table 1, the yields of the compounds of Examples 1 to 8 in which the number of carbon atoms in the aliphatic hydrocarbon group of each $R^A$ in Formula (1) is 12 or more are as good as 85% or more, and compared to the yield in a case where the compound of Comparative Example 1, in which the number of carbon atoms in the aliphatic hydrocarbon group of each $R^A$ in Formula (1) is less than 12, is used, the yield is reduced to less than 80%.

<Synthesis of Protected Peptide (7-Residue Peptide: Fmoc-Trp(Boc)-Ser(tBu)-Tyr(tBu)-dLeu-Leu-Arg(pbf)-Pro-O-Protective Group)>

Details of each abbreviation other than the above are shown below.

Trp(Boc): Boc-protected tryptophan residue
Boc: t-butoxycarbonyl group
Ser(tBu): tBu-protected serine residue
tBu: t-butyl group
Tyr(tBu): tBu-protected tyrosine residue
dLeu: D-leucine residue
Arg(pbf): pbf-protected arginine residue
pbf: 2,2,4,6,7-pentamethyldihydrobenzofuran-5-sulfonyl group
Pro: proline residue Example 9:

Synthesis of Fmoc-Pro-O-NaphTAG (1)

6-(3,5-bis(docosanoyloxybenzyloxy)naphthalen-2-yl-methanol (corresponding to the above-described compound (1-1); also referred to as "NaphTAG (1)") (2.74 g, 3.0 mmol) and Fmoc-Pro-OH (2.0 molar equivalent) were dissolved in chloroform (6.0 mL), and 4-dimethylaminopyridine (0.1 molar equivalent) and diisopropylcarbodiimide (2.0 molar equivalent) were added thereto and stirred. After the condensation reaction was completed, methanol (MeOH, 70 mL) was added thereto and stirred, and then the precipitate was filtered, washed with a mixed solvent (1:1 by volume) of methanol and acetonitrile, and dried under reduced pressure to obtain Fmoc-Pro-O-NaphTAG (1) (3.78 g, yield: 99.0%).

Electrospray ionization mass spectrometry (ESI-MS) (+)=1,231.9

Example 10:

Synthesis of Fmoc-Leu-Arg(pbf)-Pro-O-NaphTAG (1)

Fmoc-Pro-O-NaphTAG (1) (2.0 g, 1.62 mmol) was dissolved in chloroform (4.0 mL), and diazabicycloundecene (DBU, 2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Leu-Arg(pbf)-OH (1.25 molar equivalent) and (1-cyano-2-ethoxy-2-oxoethylidenaminooxy)dimethylamino-morpholino-carbenium hexafluorophosphate (COMU, 1.25 molar equivalent) were added thereto and stirred. After the condensation reaction was completed, MeOH (140 mL) was added thereto and stirred, and then the precipitate was filtered, washed with a mixed solvent (1:1 by volume) of methanol and acetonitrile, and dried under reduced pressure to obtain Fmoc-Leu-Arg(pbf)-Pro-O-NaphTAG (1) (2.72 g, yield: 95.6%).

ESI-MS(+)=1,752.2

Example 11

Synthesis of Fmoc-dLeu-Leu-Arg(pbf)-Pro-O-NaphTAG (1)

Fmoc-Leu-Arg(pbf)-Pro-O-NaphTAG (1) (2.5 g, 1.40 mmol) was dissolved in chloroform (3.5 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-dLeu-OH (1.25 molar equivalent) and COMU (1.25 molar equivalent) were added thereto and stirred. After the condensation reaction was completed, MeOH (85 mL) was added thereto and stirred, and then the precipitate was filtered, washed with a mixed solvent (1:1 by volume) of methanol and acetonitrile, and dried under reduced pressure to obtain Fmoc-dLeu-Leu-Arg(pbf)-Pro-O-NaphTAG (1) (2.56 g, yield: 97.1%).

ESI-MS(+)=1,865.3

Example 12

Synthesis of Fmoc-Tyr(tBu)-dLeu-Leu-Arg(pbf)-Pro-O-NaphTAG (1)

Fmoc-dLeu-Leu-Arg(pbf)-Pro-O-NaphTAG (1) (2.19 g, 1.17 mmol) was dissolved in chloroform (3.0 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Try(tBu)-OH (1.25 molar equivalent) and COMU (1.25 molar equivalent) were added thereto and stirred. After the condensation reaction was completed, MeOH (75 mL) was added thereto and stirred, and then the precipitate was filtered, washed with a mixed solvent (1:1 by volume) of methanol and acetonitrile, and dried under reduced pressure to obtain Fmoc-Tyr(tBu)-dLeu-Leu-Arg(pbf)-Pro-O-NaphTAG (1) (2.44 g, yield: 97.1%).

ESI-MS(+)=2,084.4

Example 13

Synthesis of Fmoc-Ser(tBu)-Tyr(tBu)-dLeu-Leu-Arg(pbf)-Pro-O-NaphTAG (1)

Fmoc-Tyr(tBu)-dLeu-Leu-Arg(pbf)-Pro-O-NaphTAG (1) (1.63 g, 0.78 mmol) was dissolved in chloroform (2.0 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Ser(tBu)-OH (1.25 molar equivalent) and COMU (1.25 molar equivalent) were added thereto and stirred. After the condensation reaction was completed, MeOH (55 mL) was added thereto and stirred, and then the precipitate was filtered, washed with a mixed solvent (1:1 by volume) of methanol and acetonitrile, and dried under reduced pressure to obtain Fmoc-Ser(tBu)-Tyr(tBu)-dLeu-Leu-Arg(pbf)-Pro-O-NaphTAG (1) (1.68 g, yield: 96.6%).

ESI-MS(+)=2,227.5

Example 14

Synthesis of Fmoc-Trp(Boc)-Ser(tBu)-Tyr(tBu)-dLeu-Leu-Arg(pbf)-Pro-O-NaphTAG (1)

Fmoc-Ser(tBu)-Tyr(tBu)-dLeu-Leu-Arg(pbf)-Pro-O-NaphTAG (1) (1.07 g, 0.48 mmol) was dissolved in chloroform (1.2 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Trp(Boc)-OH (1.25 molar equivalent) and COMU (1.25 molar equivalent) were added thereto and stirred. After the condensation reaction was completed, MeOH (38 mL) was added thereto and stirred, and then the precipitate was filtered, washed with a mixed solvent (1:1 by volume) of methanol and acetonitrile, and dried under reduced pressure to obtain Fmoc-Trp(Boc)-Ser(tBu)-Tyr(tBu)-dLeu-Leu-Arg(pbf)-Pro-O-NaphTAG (1) (1.13 g, yield: 93.5%).

ESI-MS(+)=2,513.6

Comparative Example 2

Synthesis of Fmoc-Pro-O-TAG (1)

3,5-bis(docosanoyloxy)benzyl alcohol (also referred to as "TAG (1)") (2.27 g, 3.0 mmol) and Fmoc-Pro-OH (2.0 molar equivalent) were dissolved in chloroform (6.0 mL), and 4-dimethylaminopyridine (0.1 molar equivalent) and diisopropylcarbodiimide (2.0 molar equivalent) were added thereto and stirred. After the condensation reaction was completed, MeOH (70 mL) was added thereto and stirred, and then the precipitate was filtered, washed with a mixed solvent (1:1 by volume) of methanol and acetonitrile, and dried under reduced pressure to obtain Fmoc-Pro-O-TAG (1) (3.04 g, yield: 94.0%).

ESI-MS(+)=1,074.9

Comparative Example 3

Synthesis of Fmoc-Leu-Arg(pbf)-Pro-O-TAG (1)

Fmoc-Pro-O-TAG (1) (2.0 g, 1.86 mmol) was dissolved in chloroform (4.6 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Leu-Arg(pbf)-OH (1.25 molar equivalent) and COMU (1.25 molar equivalent) were added thereto and stirred. After the condensation reaction was completed, MeOH (140 mL) was added thereto and stirred, and then the precipitate was filtered, washed with a mixed solvent (1:1 by volume) of methanol and acetonitrile, and dried under reduced pressure to obtain Fmoc-Leu-Arg(pbf)-Pro-O-TAG (1) (2.73 g, yield: 90.1%).

ESI-MS(+)=1,610.1

Comparative Example 4

Synthesis of Fmoc-dLeu-Leu-Arg(pbf)-Pro-O-TAG (1)

Fmoc-Leu-Arg(pbf)-Pro-O-TAG (1) (2.23 g, 1.40 mmol) was dissolved in chloroform (3.5 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-dLeu-OH (1.25 molar equivalent) and COMU (1.25 molar equivalent) were added thereto and stirred. After the condensation reaction was completed, MeOH (80 mL) was added thereto and stirred, and then the precipitate was filtered, washed with a mixed solvent (1:1 by volume) of methanol and acetonitrile, and dried under reduced pressure to obtain Fmoc-dLeu-Leu-Arg(pbf)-Pro-O-TAG (1) (2.23 g, yield: 92.3%).

ESI-MS(+)=1,709.2

Comparative Example 5

Synthesis of Fmoc-Tyr(tBu)-dLeu-Leu-Arg(pbf)-Pro-O-TAG (1)

Fmoc-dLeu-Leu-Arg(pbf)-Pro-O-TAG (1) (2.00 g, 1.17 mmol) was dissolved in chloroform (3.0 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Try(tBu)-OH (1.25 molar equivalent) and COMU (1.25 molar equivalent) were added thereto and stirred. After the condensation reaction was completed, MeOH (75 mL) was added thereto and stirred, and then the precipitate was filtered, washed with a mixed solvent (1:1 by volume) of methanol and acetonitrile, and dried under reduced pressure to obtain Fmoc-Tyr(tBu)-dLeu-Leu-Arg(pbf)-Pro-O-TAG (1) (1.98 g, yield: 87.8%).

ESI-MS(+)=1,928.3

Comparative Example 6

Synthesis of Fmoc-Ser(tBu)-Tyr(tBu)-dLeu-Leu-Arg(pbf)-Pro-O-TAG (1)

Fmoc-Tyr(tBu)-dLeu-Leu-Arg(pbf)-Pro-O-TAG (1) (1.63 g, 0.78 mmol) was dissolved in chloroform (2.0 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Ser(tBu)-OH (1.25 molar equivalent) and COMU (1.25 molar equivalent) were added thereto and stirred. After the condensation reaction was completed, MeOH (55 mL) was added thereto and stirred, and then the precipitate was filtered, washed with a mixed solvent (1:1 by volume) of methanol and acetonitrile, and dried under reduced pressure to obtain Fmoc-Ser(tBu)-Tyr(tBu)-dLeu-Leu-Arg(pbf)-Pro-O-TAG (1) (1.26 g, yield: 78.2%).

ESI-MS(+)=2,071.4

Comparative Example 7

Synthesis of Fmoc-Trp(Boc)-Ser(tBu)-Tyr(tBu)-dLeu-Leu-Arg(pbf)-Pro-O-TAG (1)

Fmoc-Ser(tBu)-Tyr(tBu)-dLeu-Leu-Arg(pbf)-Pro-O-TAG (1) (1.07 g, 0.48 mmol) was dissolved in chloroform (1.2 mL), and DBU (2.0 molar equivalent) was added thereto and stirred. After the deprotection reaction was completed, a chloroform solution including methanesulfonic acid (2.1 molar equivalent) and N-methylmorpholine (2.1 molar equivalent) was added thereto, and Fmoc-Trp(Boc)-OH (1.25 molar equivalent) and COMU (1.25 molar equivalent) were added thereto and stirred. After the condensation reaction was completed, MeOH (38 mL) was added thereto and stirred, and then the precipitate was filtered, washed with a mixed solvent (1:1 by volume) of methanol and acetonitrile, and dried under reduced pressure to obtain Fmoc-Trp(Boc)-Ser(tBu)-Tyr(tBu)-dLeu-Leu-Arg(pbf)-Pro-O-TAG (1) (0.44 g, yield: 38.7%).

ESI-MS(+)=2,357.56

The results are summarized in Table 2.

TABLE 2

| Number of amino acid residues | Amino acid sequence | Protective group NaphTAG (1) | Protective group TAG (1) |
|---|---|---|---|
| 1 | Fmoc-Pro-O-protective group | 99.0% (Example 9) | 94.0% (Comparative example 2) |
| 3 | Fmoc-Leu-Arg(pbf)-Pro-O-protective group | 95.6% (Example 10) | 90.1% (Comparative example 3) |
| 4 | Fmoc-dLeu-Leu--Arg(pbf)-Pro-O-protective group | 97.1% (Example 11) | 92.3% (Comparative example 4) |
| 5 | Fmoc-Tyr(tBu)-dLeu-Leu-Arg(pbf)-Pro-O-protective group | 97.1% (Example 12) | 87.8% (Comparative example 5) |
| 6 | Fmoc-Ser(tBu)-Tyr(tBu)-dLeu-Leu-Arg(pbf)-Pro-O-protective group | 96.6% (Example 13) | 78.2% (Comparative example 6) |
| 7 | Fmoc-Trp(Boc)-Ser(tBu)-Tyr(tBu)-dLeu-Leu-Arg(pbf)-Pro-O-protective group | 93.5% (Example 14) | 38.7% (Comparative example 7) |
| Total yield until synthesis of above peptide compound having 7 amino acid residues | | 80.6% | 20.8% |

As shown in Table 2, the condensed polycyclic aromatic hydrocarbon compound represented by Formula (1), which is used in Examples 9 to 14, is superior in yield of the obtained peptide compound as compared with the compound used in Comparative Examples 2 to 7.

In addition, as shown in Table 2, it can be seen that the condensed polycyclic aromatic hydrocarbon compound represented by Formula (1) is excellent in yield even in the total yield.

The disclosure of Japanese Patent Application No. 2019-035853 filed on Feb. 28, 2019 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A method for producing a peptide compound, comprising:

a condensed polycyclic aromatic hydrocarbon compound represented by Formula (1),

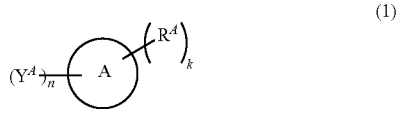

in Formula (1),
a ring A represents a condensed polycyclic aromatic hydrocarbon ring selected from the group consisting of a naphthalene ring, an anthracene ring, a phenanthrene ring, a tetracene ring, a triphenylene ring, a pyrene ring, and a chrysene ring,
$Y^A$'s each independently represent —$CH_2OH$, —$CH_2NHR$, —$CH_2SH$, or —$CH_2X^0$, where R represents a hydrogen atom, an alkyl group, or an aralkyl group, and $X^0$ represents Cl, Br, or I,
k represents an integer of 1 to 5 and n represents 1 or 2,
$R^A$'s each independently represent an aliphatic hydrocarbon group or an organic group having an aliphatic hydrocarbon group,
the ring A may further have a substituent in addition to $Y^A$ and $R^A$, and
a total number of carbon atoms in all aliphatic hydrocarbon groups included in all $R^A$'s is 36 to 100, and
wherein the condensed polycyclic aromatic hydrocarbon compound has at least one aliphatic hydrocarbon group having 18 to 100 carbon atoms in at least one $R^A$.

2. The protective group-forming reagent according to claim 1,
wherein the protective group-forming reagent is a protective group-forming reagent of a carboxy group or an amide group.

3. The protective group-forming reagent according to claim 1,
wherein the protective group-forming reagent is a C-terminal protective group-forming reagent of an amino acid compound or a peptide compound.

4. The protective group-forming reagent according to claim 1,
wherein the ring A does not have an additional substituent other than $Y^A$ and $R^A$.

5. The protective group-forming reagent according to claim 1,
wherein the ring A is a naphthalene ring.

6. The protective group-forming reagent according to claim 5,
wherein at least one RA is a group represented by Formula (f1),

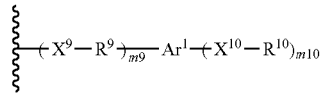

in Formula (f1), a wavy line portion represents a bonding position to the naphthalene ring, m9 represents an integer of 1 to 3, $X^9$'s each independently represent a single bond, —O—, —S—, —COO—, —OCO—, —OCONH—, —NHCONH—, —NHCO—, or —CONH—, R9's each independently represent a divalent aliphatic hydrocarbon group, $Ar^1$ represents an (m10+1)-valent aromatic group or an (m10+1)-valent heteroaromatic group, m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 18 to 60 carbon atoms.

7. A condensed polycyclic aromatic hydrocarbon compound represented by Formula (1a),

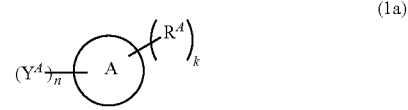

in Formula (1a),
a ring A represents a condensed polycyclic aromatic hydrocarbon ring selected from the group consisting of a naphthalene ring, an anthracene ring, a phenanthrene ring, a tetracene ring, a triphenylene ring, a pyrene ring, and a chrysene ring,
$Y^A$'s each independently represent —$CH_2OH$, —$CH_2NHR$, —$CH_2SH$, or —$CH_2X^0$, where R represents a hydrogen atom, an alkyl group, or an aralkyl group, and $X^0$ represents Cl, Br, or I,
k represents an integer of 1 to 5 and n represents 1 or 2,
$R^A$'s each independently represent an aliphatic hydrocarbon group or an organic group having an aliphatic hydrocarbon group,
the ring A may further have a substituent in addition to $Y^A$ and $R^A$, and
a total number of carbon atoms in all aliphatic hydrocarbon groups included in all $R^A$'s is 36 to 100, and
wherein the condensed polycyclic aromatic hydrocarbon compound has at least one aliphatic hydrocarbon group having 18 to 100 carbon atoms in at least one $R^A$.

8. The condensed polycyclic aromatic hydrocarbon compound according to claim 7,
wherein the ring A is a naphthalene ring.

9. The condensed polycyclic aromatic hydrocarbon compound according to claim 8,
wherein at least one $R^A$ is a group represented by Formula (f1),

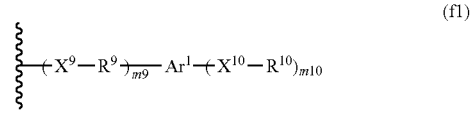

in Formula (f1), a wavy line portion represents a bonding position to the naphthalene ring, m9 represents an integer of 1 to 3, $X^9$'s each independently represent a single bond, —O—, —S—, —COO—, —OCO—, —OCONH—, —NHCONH—, —NHCO—, or —CONH—, R9's each independently represent a divalent aliphatic hydrocarbon group, $Ar^1$ represents an (m10+1)-valent aromatic group or an (m10+1)-valent heteroaromatic group, m10 represents an integer of 1 to 3, X10's each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 18 to 60 carbon atoms.

10. The condensed polycyclic aromatic hydrocarbon compound according to claim 7,
wherein the condensed polycyclic aromatic hydrocarbon compound represented by Formula (1a) is a compound represented by any of Formula (10a), Formula (20a), or Formula (30a),

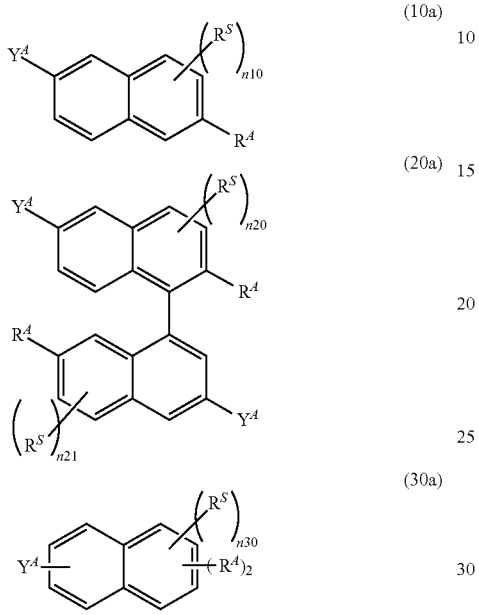

in Formula (10a), Formula (20a), and Formula (30a), $Y^A$'s each independently represent —CH$_2$OH, —CH$_2$NHR, —CH$_2$SH, or —CH$_2$X$^O$, where R represents a hydrogen atom, an alkyl group, or an aralkyl group, and X$^O$ represents Cl, Br, or I, $R^A$'s each independently represent an aliphatic hydrocarbon group or an organic group having an aliphatic hydrocarbon group, the number of carbon atoms in at least one aliphatic hydrocarbon group included in at least one $R^A$ is 18 to 100, $R^S$'s each independently represent a substituent, n10 represents an integer of 0 to 6, and n20, n21, and n30 each independently represent an integer of 0 to 5.

11. The condensed polycyclic aromatic hydrocarbon compound according to claim 10,
wherein $R^A$'s in Formula (10a), Formula (20a), or Formula (30a) are each independently a group represented by Formula (f1) or Formula (a1),

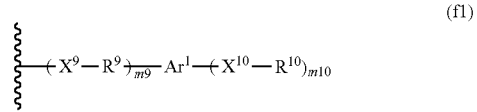

in Formula (f1), a wavy line portion represents a bonding position to a naphthalene ring, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 18 to 60 carbon atoms, and

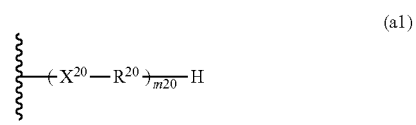

in Formula (a1), a wavy line portion represents a bonding position to a naphthalene ring, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group.

12. The condensed polycyclic aromatic hydrocarbon compound according to claim 11,
wherein the group represented by Formula (f1) is a group represented by Formula (f2),

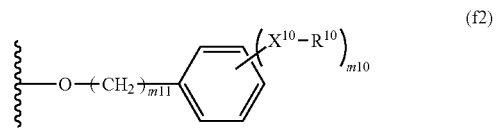

in Formula (f2), a wavy line portion represents a bonding position to a naphthalene ring, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 18 to 60 carbon atoms.

13. The condensed polycyclic aromatic hydrocarbon compound according to claim 11,
wherein $X^{20}$ in Formula (a1), which is bonded to the naphthalene ring, is —O—.

14. The condensed polycyclic aromatic hydrocarbon compound according to claim 7,
wherein the ring A does not have an additional substituent other than $Y^A$ and $R^A$.

* * * * *